United States Patent [19]
Ishii

[11] Patent Number: 5,134,582
[45] Date of Patent: Jul. 28, 1992

[54] MEMORY SYSTEM FOR ANDING DATA BITS ALONG COLUMNS OF AN INVERTED MEMORY ARRAY

[75] Inventor: Takatoshi Ishii, Tokyo, Japan

[73] Assignee: ASCII Corporation, Tokyo, Japan

[21] Appl. No.: 638,156

[22] Filed: Jan. 10, 1991

Related U.S. Application Data

[60] Continuation of Ser. No. 221,905, Jul. 20, 1988, abandoned, which is a division of Ser. No. 877,783, Jun. 24, 1986, abandoned.

[30] Foreign Application Priority Data

| Jun. 25, 1985 | [JP] | Japan | 60-138304 |
| Jun. 25, 1985 | [JP] | Japan | 60-138305 |
| Jul. 15, 1985 | [JP] | Japan | 60-156707 |
| Jul. 18, 1985 | [JP] | Japan | 60-158592 |
| Aug. 28, 1985 | [JP] | Japan | 60-187420 |

[51] Int. Cl.⁵ .............. G11C 7/00; G11C 12/00; G06F 15/62
[52] U.S. Cl. .............. 365/189.08; 365/189.05; 365/238.5; 365/63; 395/164; 395/425; 340/799; 340/803
[58] Field of Search ............ 365/238.5, 63, 189.05, 365/230.03, 230.04, 230.05, 189.08; 340/750, 799, 803; 364/518, 521, 522; 395/425, 164

[56] References Cited

U.S. PATENT DOCUMENTS

| 3,681,763 | 8/1972 | Meade et al. | 365/189.01 |
| 4,559,618 | 12/1985 | Houseman et al. | 365/230.03 |
| 4,667,308 | 5/1987 | Hayes et al. | 364/900 |
| 4,670,846 | 6/1987 | Laws | 364/200 |
| 4,740,927 | 4/1988 | Baker et al. | 365/238.5 |
| 4,742,474 | 5/1988 | Knierim | 365/230.03 |
| 4,755,810 | 7/1988 | Knierim | 349/799 |

FOREIGN PATENT DOCUMENTS 3313441 10/1984 Fed. Rep. of Germany.
0025860 2/1980 Japan ............ 365/230.03

Primary Examiner—Glenn Gossage
Attorney, Agent, or Firm—Cushman, Darby & Cushman

[57] ABSTRACT

A memory system is provided with two data buffers, respectively, in the row and column directions of a memory array. The system is capable of operating either one of the two data buffers as input/output buffers in accordance with reading or writing operations on the contents of the memory array. Outputs from the memory array are inverted to form an inverted array. All bits along respective columns of the array are ANDed together to obtain an ANDed bit value for each column of the inverted array.

3 Claims, 22 Drawing Sheets

FIG. 8
DATA IS READ OUT.
DATA IS STORED.
DATA IS RIGHT-JUSTIFIED.
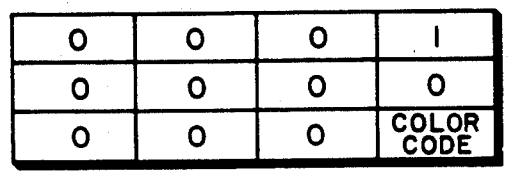
CPU PERFORMS A LOGICAL OPERATION USING THE DATA STATED IN THE LEFT.
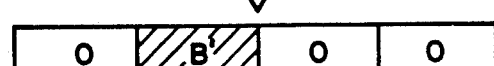
DATA IS RETURNED TO ITS ORIGINAL POSITION.
+
ORIGINAL DATA IS SET TO 0.
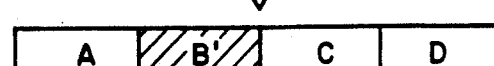
THE ABOVE TWO ARE COMBINED AND WRITTEN.

FIG. 12A
CONTENTS OF MEMORY ARRAY 50

| | BIT 7 | 6 | 5 | 4 | 3 | 2 | 1 | 0 |
|---|---|---|---|---|---|---|---|---|
| PLANE 3 | 1 | 0 | 0 | 1 | 1 | 1 | 1 | 1 |
| 2 | 0 | 1 | 0 | 0 | 0 | 1 | 0 | 0 |
| 1 | 0 | 0 | 1 | 1 | 1 | 0 | 0 | 1 |
| 0 | 0 | 1 | 0 | 1 | 0 | 0 | 0 | 1 |

FIG. 12B
CONTENTS OF INVERT PLANE MASK REGISTER 67

67: INVERT PLANE MASK REGISTER

| | | |
|---|---|---|
| PLANE 3 | 0 | OI3 → |
| 2 | 1 | OI2 → |
| 1 | 0 | OI1 → |
| 0 | 0 | OI0 → |

FIG. 12C
CONTENTS OF OUTPUTS OF MEMORY ARRAY 50 AFTER INVERTED

| BIT 7 | 6 | 5 | 4 | 3 | 2 | 1 | 0 |
|---|---|---|---|---|---|---|---|
| 1 | 0 | 0 | 1 | 1 | 1 | 1 | 1 |
| 1 | 0 | 1 | 1 | 1 | 0 | 1 | 1 |
| 0 | 0 | 1 | 1 | 1 | 0 | 0 | 1 |
| 0 | 1 | 0 | 1 | 0 | 0 | 0 | 1 |

FIG. 12D
WORD OUTPUT

| BIT 7 | 6 | 5 | 4 | 3 | 2 | 1 | 0 |
|---|---|---|---|---|---|---|---|
| 0 | 0 | 0 | 1 | 0 | 0 | 0 | 1 |
| DT 7 | 6 | 5 | 4 | 3 | 2 | 1 | 0 |

FIG. 13A
CONTENTS OF MEMORY ARRAY 50

| | BIT 7 | 6 | 5 | 4 | 3 | 2 | 1 | 0 |
|---|---|---|---|---|---|---|---|---|
| PLANE 3 | 0 | 0 | 0 | 1 | 0 | 0 | 0 | 0 |
| 2 | 0 | 0 | 0 | 0 | 0 | 1 | 0 | 0 |
| 1 | 0 | 0 | 0 | 1 | 0 | 1 | 0 | 0 |
| 0 | 0 | 0 | 0 | 1 | 0 | 0 | 1 | 0 |

FIG. 13B
CONTENTS OF INVERT PLANE MASK REGISTER 67

| | | |
|---|---|---|
| PLANE 3 | 1 | OI3 |
| 2 | 1 | OI2 |
| 1 | 1 | OI1 |
| 0 | 1 | OI0 |

67: INVERT PLANE MASK REGISTER

FIG. 13C
CONTENTS OF OUTPUTS OF MEMORY ARRAY 50 AFTER INVERTED

| BIT 7 | 6 | 5 | 4 | 3 | 2 | 1 | 0 |
|---|---|---|---|---|---|---|---|
| 1 | 1 | 1 | 0 | 1 | 1 | 1 | 1 |
| 1 | 1 | 1 | 1 | 1 | 0 | 1 | 1 |
| 1 | 1 | 1 | 0 | 1 | 0 | 1 | 1 |
| 1 | 1 | 1 | 0 | 1 | 1 | 0 | 1 |

FIG. 13D
WORD OUTPUT

| BIT 7 | 6 | 5 | 4 | 3 | 2 | 1 | 0 |
|---|---|---|---|---|---|---|---|
| 1 | 1 | 1 | 0 | 1 | 0 | 0 | 1 |
| DT 7 | 6 | 5 | 4 | 3 | 2 | 1 | 0 |

MEMORY SYSTEM FOR ANDING DATA BITS ALONG COLUMNS OF AN INVERTED MEMORY ARRAY

This is a continuation of application Ser. No. 07/221,905, filed on Jul 20, 1988, which was abandoned upon the filing hereof which is a division of application Ser. No. 06/877,783, filed on Jun. 24, 1986, now abandoned.

BACKGROUND OF THE INVENTION

1. Field of the Invention

The present invention relates to a memory system.

2. Description of the Prior Art

Recently, video memory capacities have remarkably increased, as the resolving power of screens have been enhanced and also as the number of colors to be displayed has increased.

In general, when video memory capacity is expanded a problem arises in that the time required to process data to be displayed is extended in proportion to the capacity increase. To solve this problem, conventional display data processors have been improved to speed up the time to process display data. However, there is a limit to memory access speed.

In other words, when a display memory is of a word-structure, the time for accessing each pixel will be unfavorably delayed. Also, when the display memory has a side-by-side-pixel structure, another problem arises in that bit locations must be processed within a word, resulting in delayed access.

In particular, the problem associated with a display memory having a word structure will be described below. In connection with this description, FIGS. 7(A)-(D) provide an explanatory schematic of a word structure display memory.

When character information is to be written into a word structure display memory, it can be expected that the value of a plane select register is set according to a color code and font pattern data is written (see FIG. 7 (A)). In this case, the character information can be written at very high speed.

However, if the background color is not "0", then the information or data must be written into respective planes separately. Therefore, the greater the number of planes to write, the slower the writing speed is (that is, the writing operation requires an amount of time proportional to the number of planes).

Also, when only 1 dot of a display screen is to be written a longer time is necessary for processing it. This is because after data is read out from each of the planes (FIG. 7 (B)), only one or more bit locations to be altered are written back to "1" or "0" (FIG. 7 (C)), which operation must be performed repetitively for all of the planes (FIG. 7 (D)).

In general, when display data is written, most of the images/pixels are formed by combining dot-by-dot writing operations and thus the writing operations require a very long time for processing.

On the other hand, in the case of a display memory having a side-by-side-pixel structure another problem exists as follows. In connection with this description, FIG. 8 provides an explanatory schematic of a side-by-side-pixel structure display memory.

When writing display information into the display memory, a font pattern must be extended to a display color and a background color before it is written, which makes the writing time longer. Also, when the pixel length is long, the number of pixels which can be written at a time is reduced so that it takes a still longer time to write the display information.

In the side-by-side-pixel structure, it is easier to perform a dot-by-dot writing operation than in the above-mentioned word structure, but bit locations within a word vary according to pixel positions. For this reason, in order to update a pixel, a CPU or a video data processor must read out a word in which the pixel exists, then shift the pixel to the position of the bit 0 and then process it, wherever the pixel to be updated is located, next return the pixel to its prior-to-shift location, and write it back after adjacent data is added thereto.

Thus, the word structure display memory and the side-by-side-pixel structure display memory both have problems, and memory access time is a considerable limitation to overcome before performance can be enhanced.

Also, in processing an image, when the image boundary is detected or delineated (that is, an area within the boundary is given a predetermined color), it is necessary to detect a color code which is written in an image memory. In this case, data is read out from the above-mentioned image memory, a color code for each pixel is extracted from the data, and the extracted color code is compared with a desired color code in pixels.

Whether the image memory employs the word structure or the pixel structure, in order to compare color codes, it is necessary to extract a color code for each desired pixel. This means that it takes a long time to compare and detect the above-mentioned color codes. This problem remains unsolved in the prior art.

Further, the conventional memory unit is only capable of storing a given piece of information and simply reading and writing the information, that is it has only a single function. Thanks to the progress of semiconductor technology, however, a multitude of possible functions can be realized in addition to the single read and write function.

The conventional memory unit capable of only the single read and write function is becoming less and less valuable. This is a problem in that suppliers of obsolete equipment will realize decreased profits.

The conventional memory unit has also been increased gradually in capacity. So there is a tendency to expand its additional circuits.

On the other hand the memory unit of an image device can be used in two ways, that is it can be used as a video memory or as a program memory. The video memory has its own access method, while the program memory has its own access method. These two access methods are different from each other.

Therefore, a data processing system which stores large files of image data requires a video memory of large capacity and a program memory of large capacity. At the same time, the peripheral circuits of these memories must also be large-sized so that the whole system, disadvantageously, must be large-sized.

SUMMARY OF THE INVENTION

The present invention aims at eliminating the disadvantages found in the above-mentioned conventional memory units.

Accordingly, it is an object of the invention to provide a memory interface which permits both word access and pixel access.

It is another object of the invention to provide a color code detection circuit which is capable of reducing the time required to compare and detect a given color code among color codes stored in an image memory.

It is still another object of the invention to provide a memory system which is capable of performing a plurality of functions.

It is yet another object of the invention to provide a memory system in which an image memory and a program memory can coexist.

Other and further objects of the invention will become obvious upon an understanding of the illustrative embodiments about to be described or will be indicated in the appended claims, and various advantages not referred to herein will readily occur to one skilled in the art upon employment of the invention in practice.

BRIEF DESCRIPTION OF THE DRAWINGS

FIG. 8 is an explanatory view of a display memory having a side-by-side pixel structure;

FIGS. 12(A)-12(D) are explanatory views to illustrate an operation to compare color codes in the embodiment shown in FIG. 10;

FIGS. 13(A)-13(D) are explanatory views to illustrate an operation to detect the existence of color codes in the embodiment shown in FIG. 10;

DETAILED DESCRIPTION OF PREFERRED EMBODIMENTS OF THE INVENTION

Figure 1:
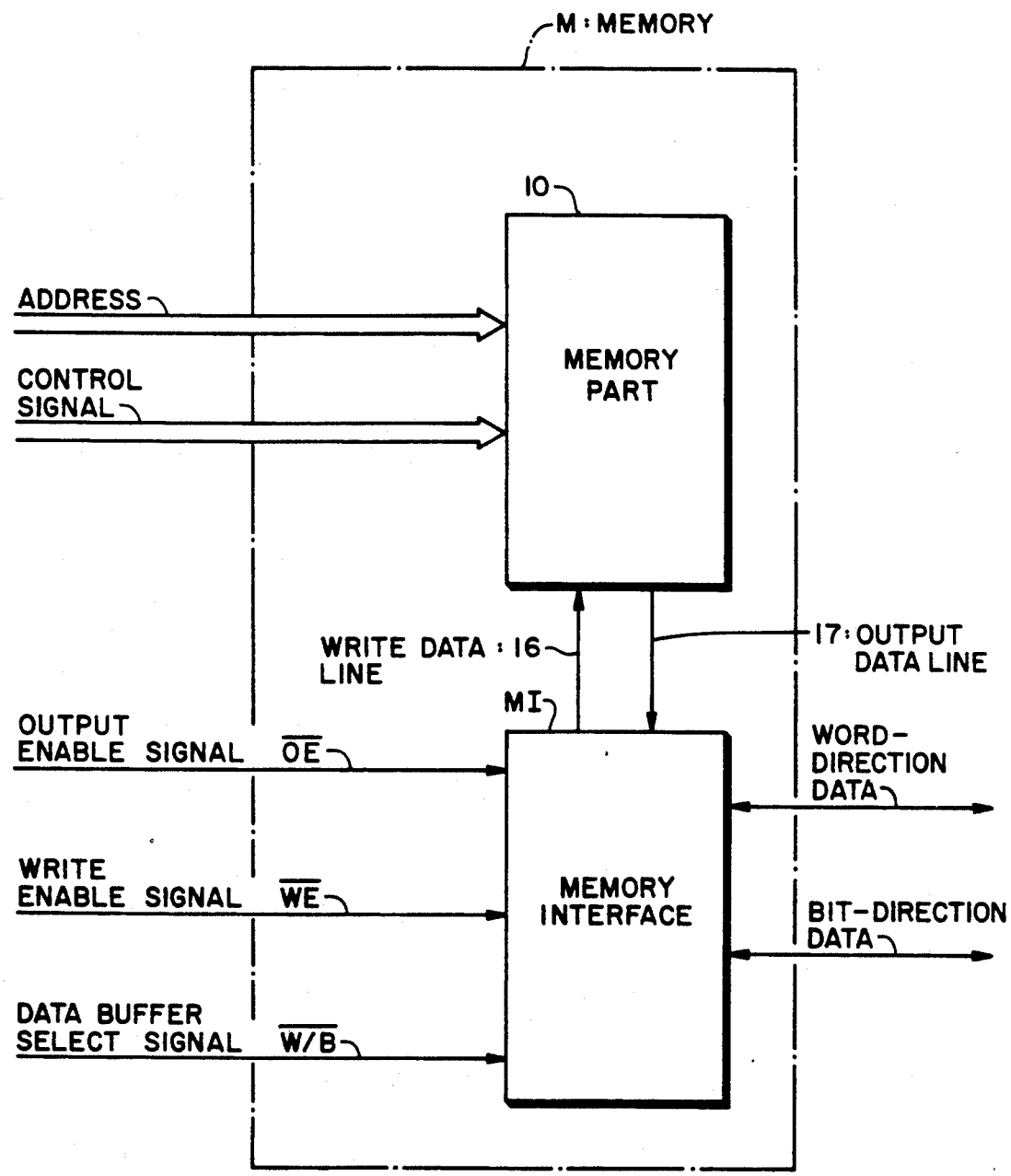
FIG. 1 is a block diagram of an embodiment of the present invention.
Figure 1A:
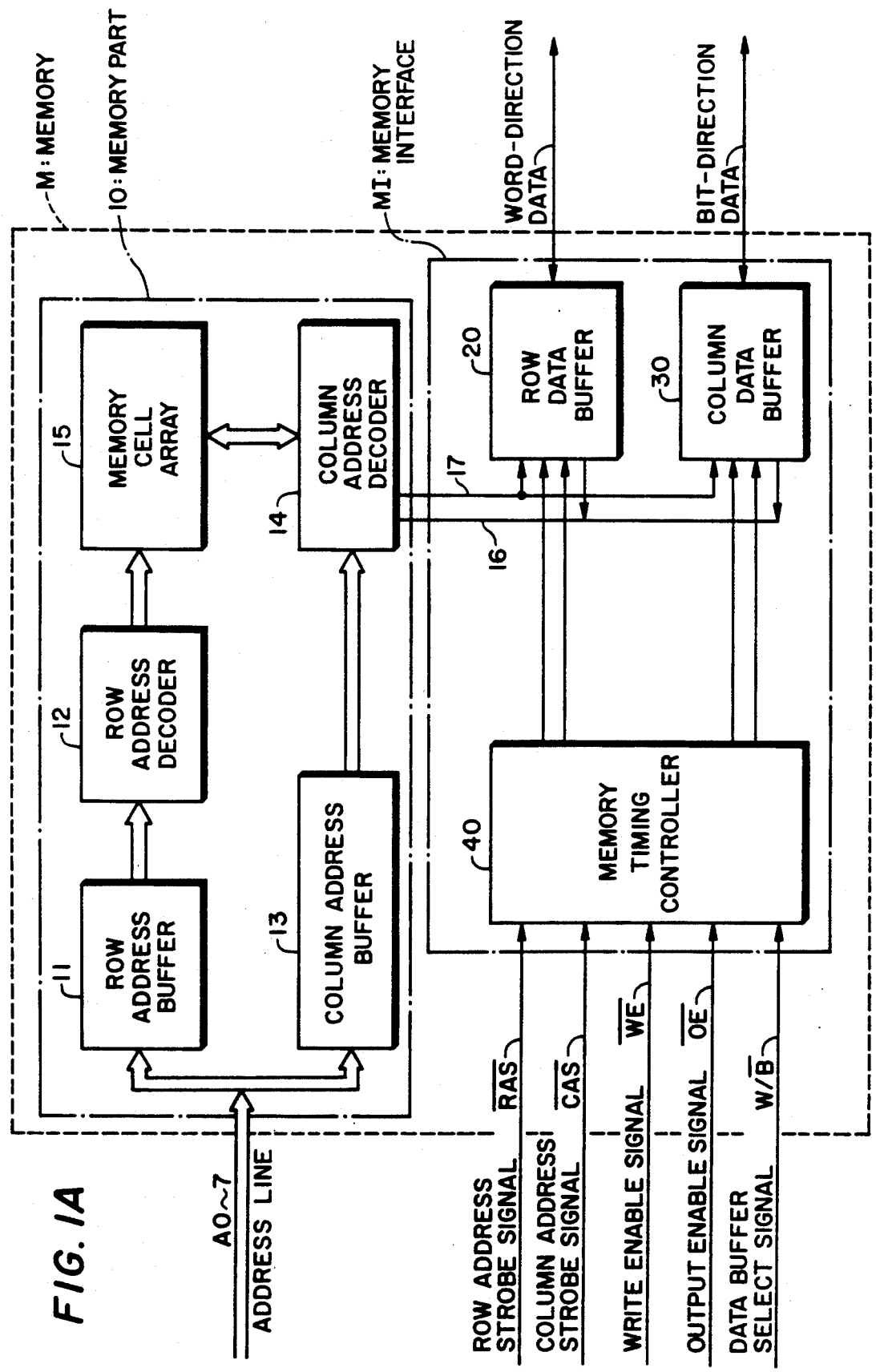
FIG. 1(A) is a block diagram of a modification of the embodiment shown in FIG. 1.

FIG. 1 shows a block diagram of an embodiment according to the invention. Memory M comprises a memory part 10 and a memory interface MI which serves as an interface for Memory Part 10. Memory Part 10 comprises a row address buffer 11, a row address decoder 12, a column address buffer 13, and a column address decoder 14, as shown in FIG. 1A.

Figure 2:
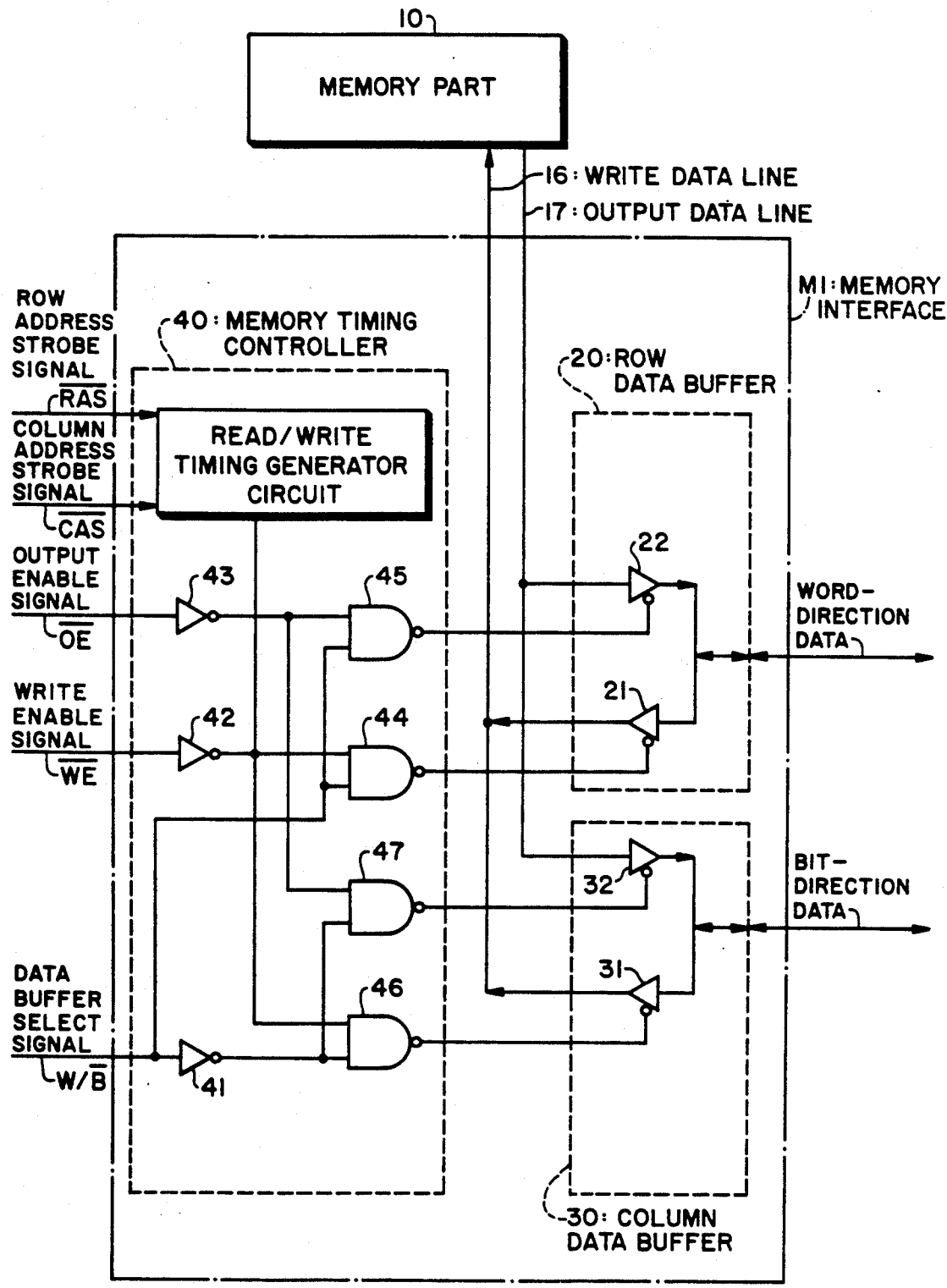
FIG. 2 is a circuit diagram showing the main portions of the embodiment in FIG. 1.

FIG. 2 shows a circuit diagram of Memory Interface MI employed in the above-mentioned embodiment of the invention. Memory Interface MI includes a row data buffer 20, a column data buffer 30, and a memory timing controller 40.

Row Data Buffer 20 includes a buffer 21 in its input direction and a buffer 22 in its output direction.

Also, Column Data Buffer 30 includes a buffer 31 in its input direction and a buffer 32 in its output direction.

Memory Timing Controller 40 includes three inverters 41, 42, 43, and four NAND circuits 44, 45, 46, 47.

Next, we will describe the operation of the above-mentioned embodiment of the invention.

Generally, in an image memory, data is accessed in two directions. The first is a row direction in which access is performed based on processings in units of words observable from a CPU or a display controller. The second is a column direction in which access is carried out based on processings in units of pixels.

When Memory Part 10 is to be accessed in the row direction, a high level or "1" signal is input to Memory Timing Controller 40 as a data buffer select signal. This signal prepares to open NAND Gates 44, 45. In this case, in order to write a given piece of data into Memory Part 10, a low level or "0" signal is given as a write enable signal and an "1" signal is given as an output enable signal.

Accordingly, a "0" signal, which has passed through Inverter 42 and NAND Circuit 44, turns on Buffer 21 and thus the row data goes to Memory Part 10 via Buffer 21 and write data line 16. Furthermore, since the output of Inverter 43 goes to a "0" level and the output of NAND Circuit 45 goes to an "1" level, Buffer 22 is turned off thereby preventing the data in output data line 17 from being read out of Memory M.

In the above case, in order to read out the given data from Memory Part 10, a "0" signal is input as an output enable signal and an "1" signal is input as a write enable signal. As a result of this, a signal, which has passed through Inverter 43 and NAND Circuit 45, turns on Buffer 22 and thus the data specified by an address is output from Memory Part 10 and externally of Memory M through Output Data Line 17 and Buffer 22.

Also, when Memory Part 10 is to be accessed in the column direction, a "0" signal is applied as the data buffer select signal to Memory Timing Controller 40, thereby preparing to open NAND Gates 46, 47. In this case, in order to write a given piece of data into Memory Part 10, a "0" signal is applied as the write enable signal and an "1" signal is applied as the output enable signal.

Consequently, a signal, which has passed through Inverter 42 and NAND Circuit 46, turns on Buffer 31, with the result that the column data is input for Memory Part 10 through Buffer 31 and Write Data Line 16. In this case, the output of Inverter 43 goes to a "0" level and the output of NAND Gate 47 goes to an "1" level, thereby turning off Buffer 32, with the result that data will not be output from Memory M through Output Data Line 17.

In order to read out data from Memory Part 10, a "0" signal is applied as the output enable signal and an "1" signal is applied as the write enable signal. Consequently, a signal, which has passed through inverter 43 and NAND Gate 47, turns on Buffer 32, so that data specified by an address is output from Memory Part 10 and externally of Memory M via Output Data Line 17 and Buffer 32.

Figure 3:
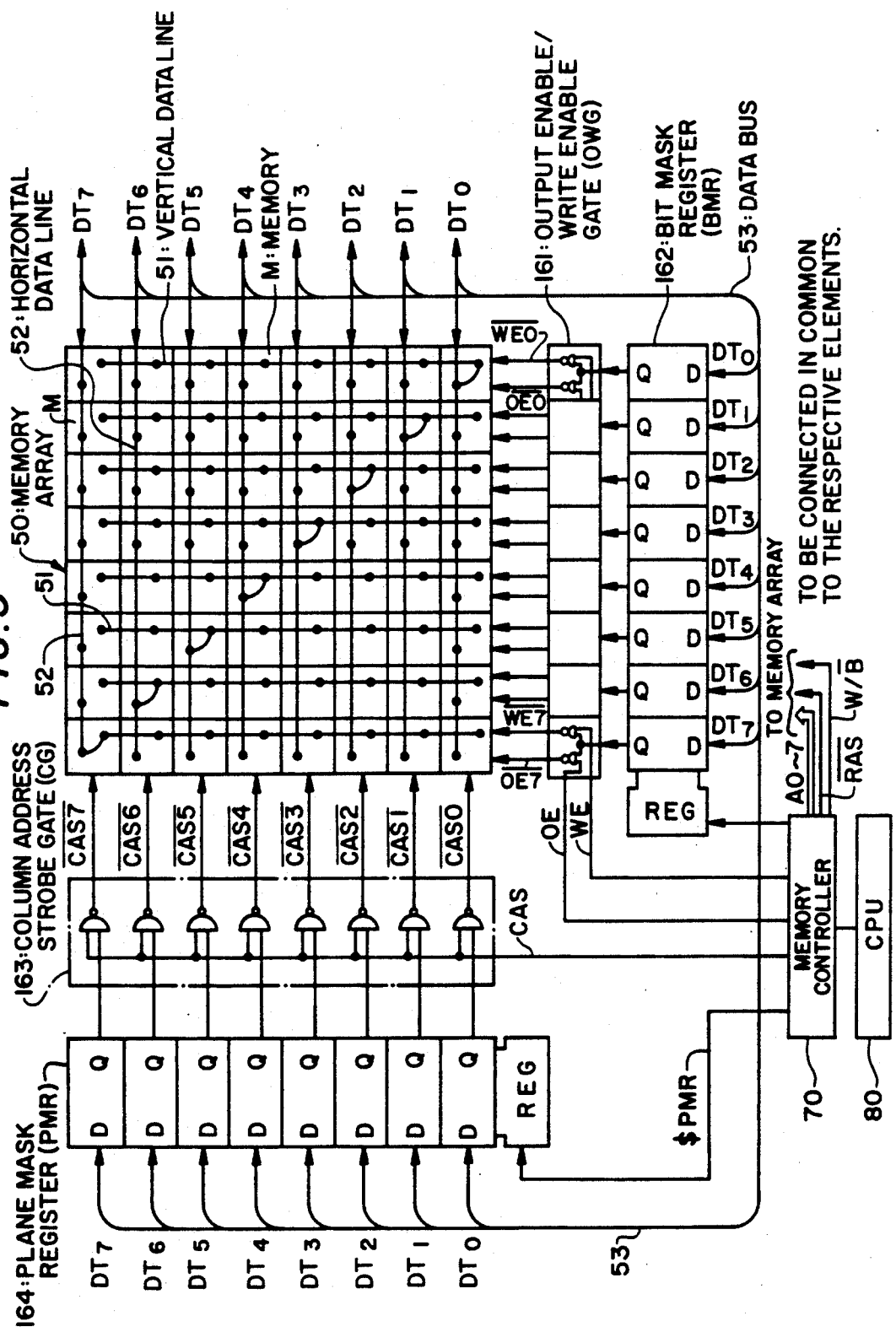
FIG. 3 is an explanatory view of another embodiment of the invention.

FIG. 3 provides an explanatory view of another embodiment of the invention. In FIG. 3, Memory Array 50 can be obtained by two-dimensionally arranging a plurality of Memories M shown in FIG. 1. Specifically, in Memory Array 50, a number of Memories M are combined in a horizontal direction to structure a word, while a number of Memories M are combined in a vertical direction to structure a pixel (display 1 dot).

Also, the row data terminals of Memories M arranged along the same row are connected to one another and the connection points thereof are then connected to vertical data lines 51 respectively. The vertical data terminals of Memories M arranged along the same pixel are connected to one another and the connection points thereof are then connected to horizontal data lines 52, respectively.

Further, the above-mentioned data lines 51, 52 are connected to one another. In this case, the same bits in data lines 51, 52 are connected with one another. As a result of this, data lines 51 and 52 can provide the same data bus, namely, data bus 53, respectively. The reason why data bus 53 can be provided in common in this manner is that the above-mentioned vertical and horizontal data lines 51 and 52 are never used at the same time.

In a plurality of Memories M arranged in the same vertical direction, the write enable signal terminals of the plurality of Memories M are connected with one another and the points of connection thereof are then connected with the write enable signal terminals of Output Enable/Write Enable gate 161. Also, in the plurality of Memories M arranged in the same vertical direction, the output enable signal terminals of the plurality of Memories M are connected with one another and the connection points thereof are then connected with the output enable signal terminals of Output Enable/Write Enable Gate 161.

On the other hand, in a plurality of Memories M arranged in the same horizontal direction, the column address strobe terminals of the plurality of Memories M are connected with one another and the connecting points thereof are then connected with the corresponding connection terminals of a column address strobe gate 163.

Outputs A 0~7, row address strobe signal and data buffer select signal from a memory controller (or a video processor) 70 are supplied in common to all Memories M in Memory Array 50.

Plane Mask Register 164 is adapted to hold mask information for each of the planes in Memory Array 50 in accordance with instructions from CPU 80 or Memory Controller 70. The outputs of Plane Mask Register 164 are supplied to Column Address Strobe Gate 163, where they are NANDed with a column address strobe signal to provide column address strobe signals for the respective planes in Memory Array 50.

Bit Mask Register 162 is adapted to hold mask information for each of the pixels in Memory Array 50 in accordance with instructions from CPU 80 or Memory Controller 70. The outputs of Bit Mask Register 162 are supplied to Output Enable/Write Enable Gate 161, where they are NANDed with an output enable signal and a write enable signal separately to provide output enable signals and write enable signals for the respective pixels in Memory Array 50.

Next will be described the operation of the above-mentioned embodiment. At first, the case where CPU 80 performs row access will be explained.

In this case, row access can be selected by setting the data buffer select signal to an "1" signal. Mask data is set according to a color to be written into Plane Mask Register 164 for a plane to be used, Bit Mask Register 162 is set to all "1s", and the memory write is then executed. Subsequently, the outputs A 0~7, row address strobe signal, column address strobe signal and write enable signal are output from Memory Controller 70 at predetermined timings.

In the case where CPU 80 runs a write operation, in parallel with the operation of Memory Controller 70, write data is output from CPU 80 and is written in the row direction/horizontal direction (X direction) via Data Line 51 and Data Bus 53. In this case, the same write data is written into each of the authorized planes. That is, in order to perform the row write operation, at least one of the bits of Plane Mask Register 164 may be set to an "1", or two or more bits thereof may be set to "1s" at the same time. As a result of this, the same write data is simultaneously written into the bits that are set to "1s". Prior to the above writing, if arbitrary data is set in Bit Mask Register 162, then the writing can be performed only into the arbitrary bit(s) or arbitrary portion(s) of the word.

When a row readout is executed, if one of the bits of Plane Mask Register 164 is set to an "1" level, then the row data corresponding to the bit that is set to an "1" level can be obtained in Data Bus 53.

Next, will be described the case where CPU 80 performs column (pixel) access. First, column access is selected by setting the data buffer select signal to a "0" level. Then, Plane Mask Register 164 is set to all "1s", and one of the bits of Bit Mask Register 162 is set, whereby either a read operation or a write operation can be executed through Data Line 52 and Data Bus 53. In this case, the values of A 0~7 are determined correspondingly to a word address in which a pixel to be accessed exists, and the values of Bit Mask Register 162 are determined correspondingly to the bit position within the word.

Pixel data, whatever pixel length it may have, can be accessed at a right-justified bit position in the data bus. That is, in FIG. 8, the pixel data can be accessed at a position illustrated to be (right-) justified to the position of Bit 0. Therefore, the processings by CPU 80 can be performed by a very simple operation.

In the above-mentioned embodiment, a plurality of planes can be accessed simultaneously for a time equal to row access time in a conventional word structure memory system, and at the same time pixel access can be performed at a higher speed than pixel access time in a conventional pixel structure memory system.

Figure 4:
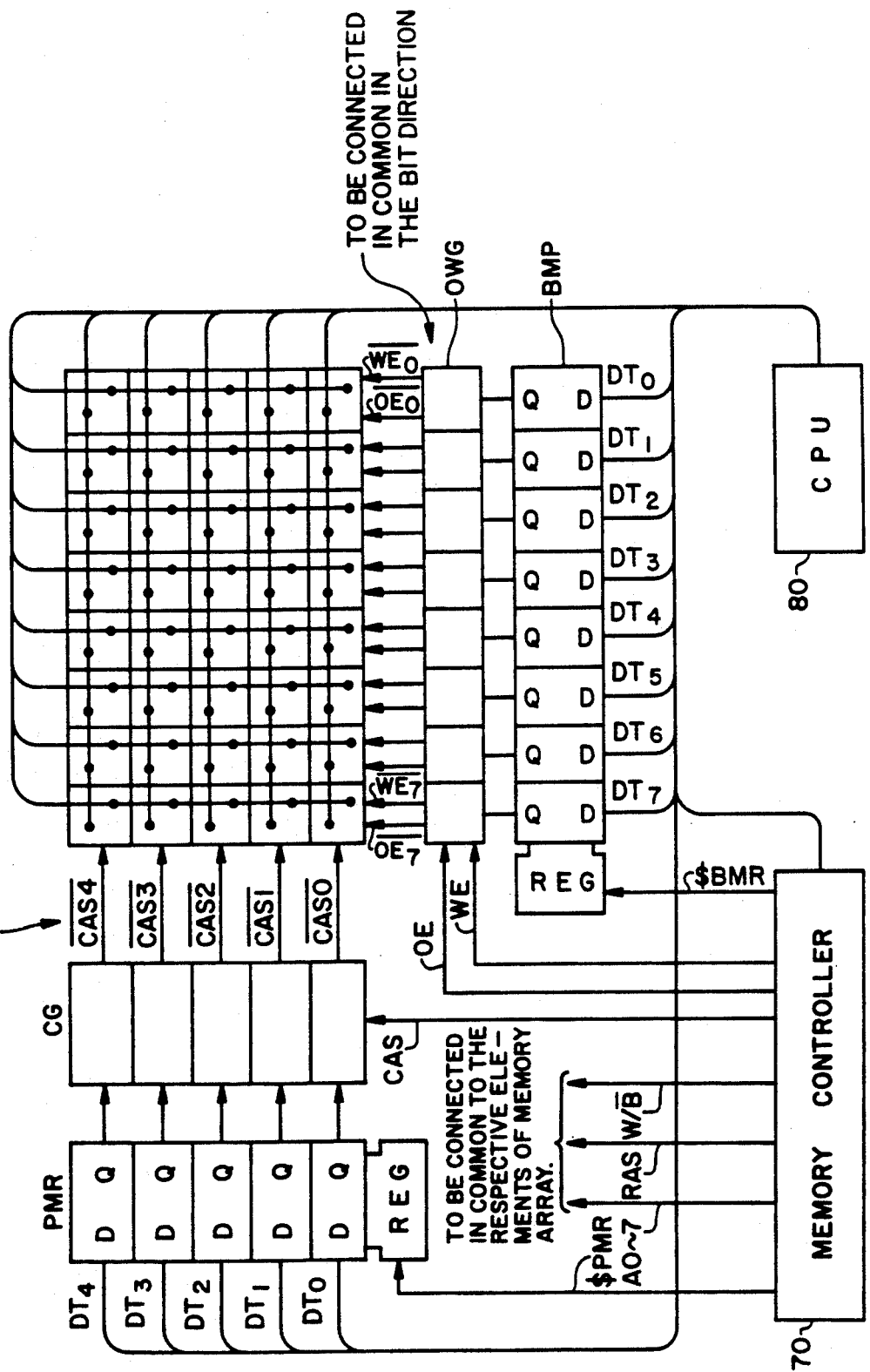
FIG. 4 is a block diagram of a further embodiment of the invention.

FIG. 4 shows a block diagram of another embodiment of the invention. In this embodiment, the number of bits in a row is greater than that of the number of bits in a column. Specifically, there are 8 bits along a row, while there are 5 bits along a column.

Figure 5:
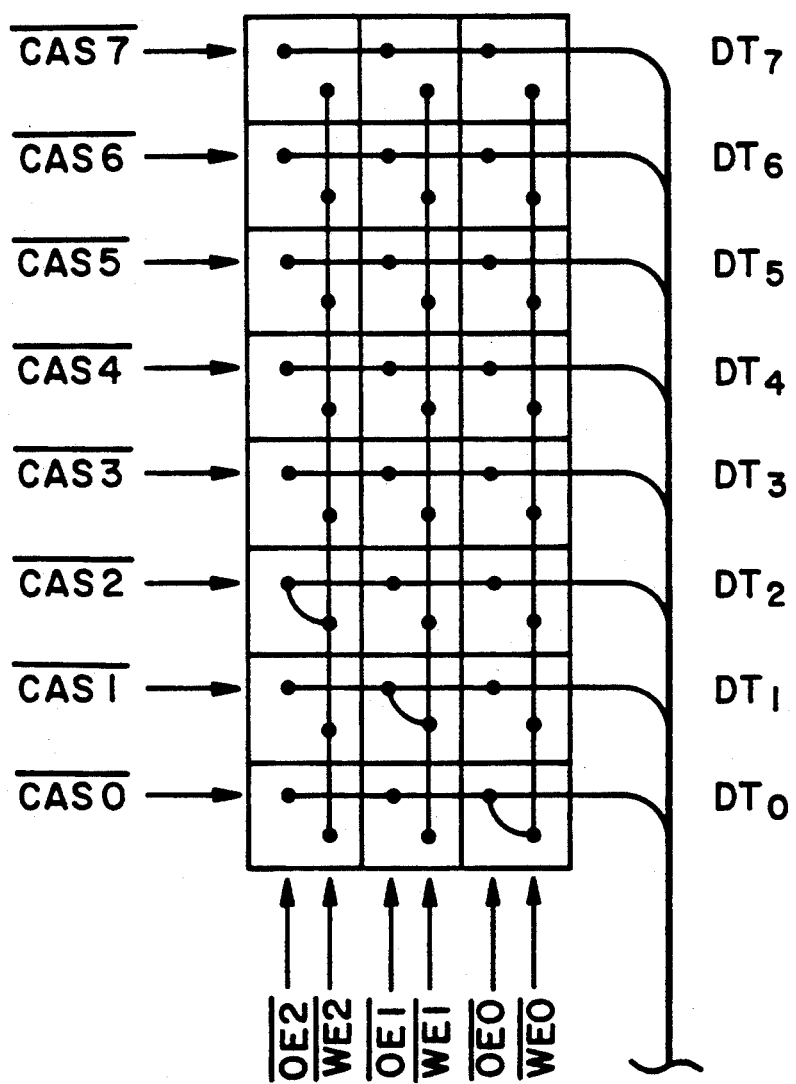
FIG. 5 is a view of a still further embodiment of the invention, showing a memory array thereof.

FIG. 5 shows a further embodiment of the invention, especially illustrating a memory array thereof. In this embodiment, the number of bits in the rows are smaller than the number of bits in the columns. Specifically, this embodiment has 3 bits in rows and 8 bits in the columns.

Bit Mask Register 162 and Plane Mask Register 164 are logically identical with each other, although they are called differently as they are applied to different uses. More particularly, Bit Mask Register 162 and Plane Mask Register 164 are interchangeable.

Figure 6:
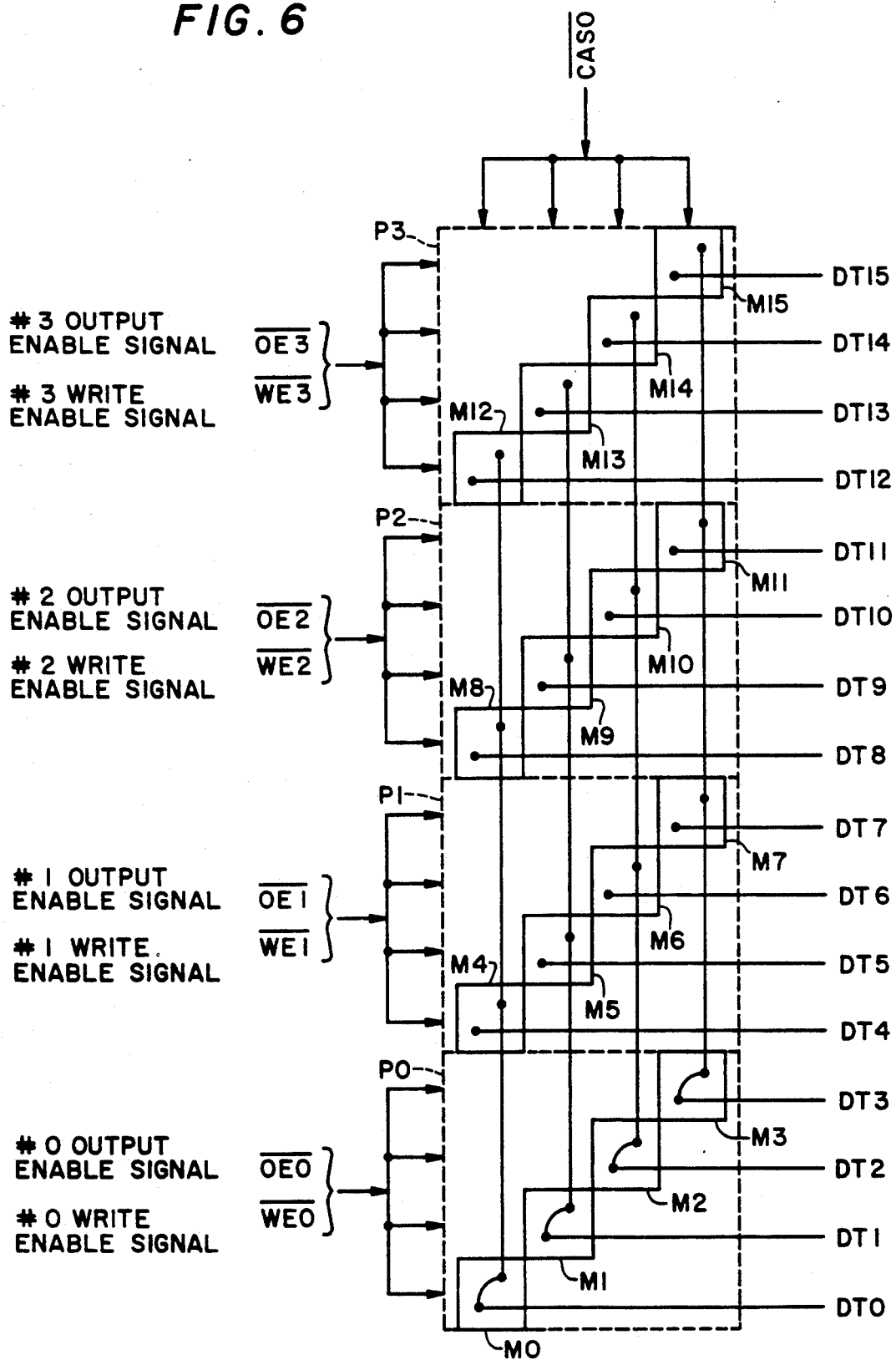
FIG. 6 is an explanatory view of a yet another embodiment of the invention.
Figure 7:
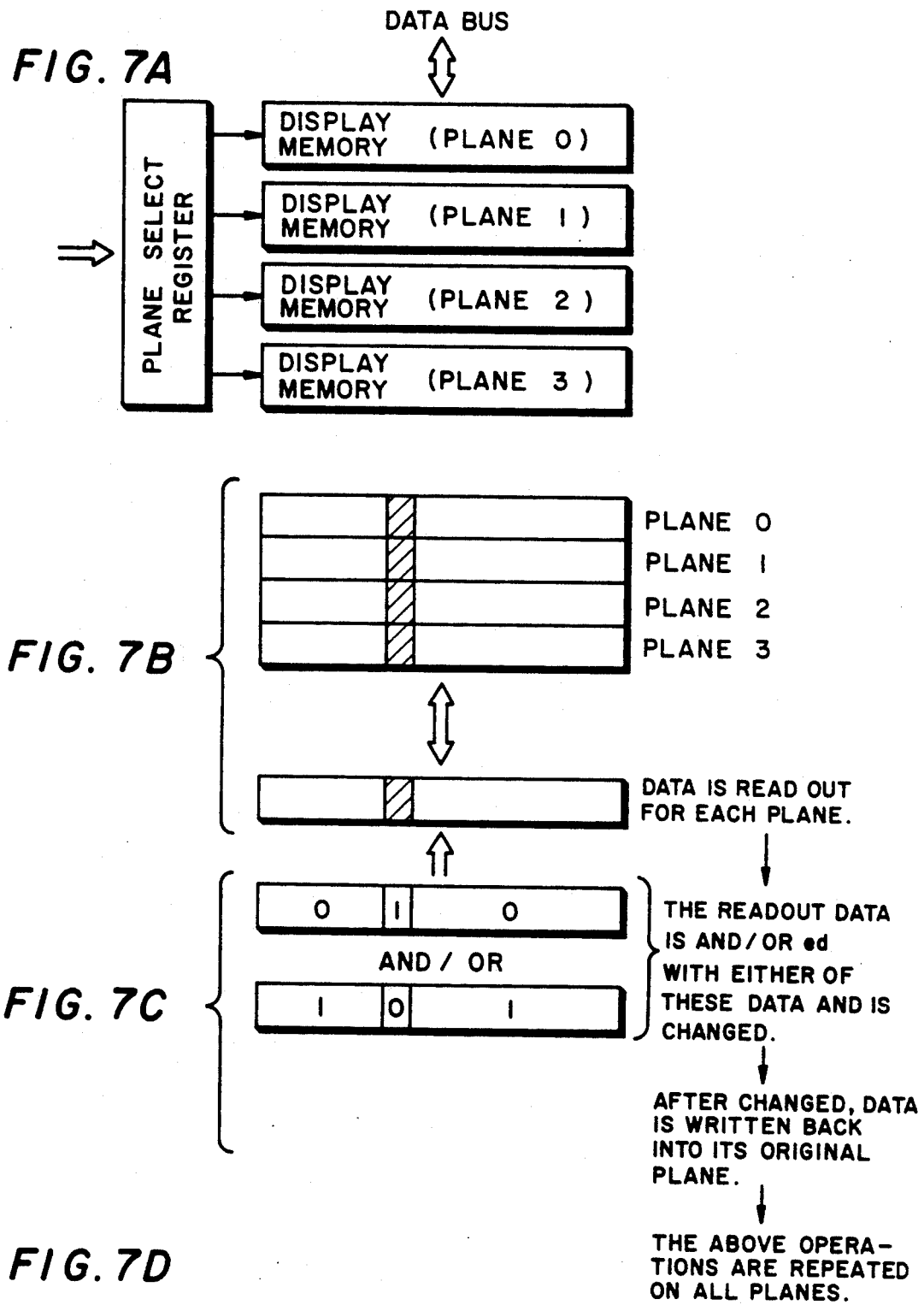
FIGS. 7(A)-7(D) are explanatory views of a display memory having a word structure.

FIG. 6 shows a still further embodiment of the invention. In this embodiment, 16 Memories M are arranged one-dimensionally. The 16 Memories M are divided into four pixels and among the corresponding bits in the respective pixels, the memories M are connected to one another. Also, pixel access is executed in units of pixels.

In other words, 16 Memories M0~M15 are arranged in one direction and these memories M0~M15 are connected with Data Lines DT0~DT15, respectively. Also, the 16 Memories M0–M15 are divided into four pixels P0, P1, P2, P3, that is, Memories 0–M3 are included in Pixel P0, Memories M4–M7 are included in Pixel P1, Memories M8–M11 are included in Pixel P2, and Memories M12–M15 are included in Pixel P3. Further, Memory M0 in Pixel P0, Memory M4 in Pixel P1, Memory M8 in Pixel P2 and Memory M12 in Pixel P3 are connected to one another. Also, Memory M1, in Pixel P0, Memory M5 in Pixel P1, Memory M9 in Pixel P2, and Memory M13 in Pixel P3 are connected to one another. Such connections are repeated in the other memories M in a similar manner among the corresponding bits in the respective pixels.

The operation of the above-mentioned embodiment will now be described. For access, a structure consisting of 1 plane of 16 bits is employed and thus the 16 bits can be read from and written to simultaneously. For pixel access the read/write operation can be performed only for the pixel that is specified among Pixels P0-P3. In this case, the write data (read data) must always be transmitted only by means of Data Lines DT0-DT3.

For example, when only Pixel P2 is written (read), only the #2 write enable signal (the #2 read enable signal) is supplied and only Pixel P2 is accessed. When writing the data, the write data is transmitted via Data Lines DT0-DT3. When reading out the data, the read data is transmitted through Data Lines DT0-DT3. Therefore, when writing or reading out the data, there is no need to shift the data as shown in FIG. 8. As a result of this the time required to process the data can be reduced.

In FIG. 6 it seems that Memories M are arranged two-dimensionally, this is because Memories M are respectively shifted right and left in order to illustrate clearly the operations of the respective pixels. Also, in the embodiment in FIG. 6, the number of Memories M may be other than 16, and the 16 memories M may be divided into other than 4 pixels.

Further, as will be readily apparent to those ordinarily skilled in the art, any type of memory can be used for Memory Part 10, such as SRAMs, DRAMs and the like.

According to the above-mentioned embodiment of the invention, both row access and pixel access are possible and, in either case, the processings can be performed at high speed.

FIG. 1A shows a block diagram of a modified version of the embodiment. Memory M includes a memory part 10 and a memory interface MI. Memory part 10 comprises row address buffer 11 for holding a row address, a row address decoder 12 for decoding the row address, a column address buffer 13 for holding a column address, a column address decoder 14 for decoding the column address, and a memory cell array 15 for storing addressable data. Memory interface MI comprises row data buffer 20, column data buffer 30, and memory timing controller 40.

Row Data Buffer 20 serves as the row input/output interface of Memory Cell Array 15, while Column Data Buffer 30 serves as the column input/output interface of Memory Cell Array 15. Also, Row Data Buffer 20 and Column Data Buffer 30 are adapted to operate independently of each other.

Memory Timing Controller 40 receives a row address strobe signal for giving a timing to take in the row address, a column address strobe signal for giving a timing to take in the column address, a write enable signal for giving a timing for writing into Memory Cell Array 15, an output enable signal for giving a timing for reading data written into Memory Cell Array 15, and a data buffer select signal for selecting either row data buffer 20 or column data buffer 30, and outputs a corresponding control signal.

For example, 16 bits of address information are divided into a row address and a column address, which addresses are then transmitted alternately by means of address lines A 0~7. The low address, after being held in Row Address Buffer 11, is decoded by Decoder 12, while the column address is decoded by Column Address Decoder 14 after being held in Column Address Buffer 13. The above-mentioned two addresses are supplied to Memory Cell Array 15 and for the memory cells that correspond to the addresses, a writing or reading operation is carried out.

As shown in FIG. 3, there is provided only one plane mask register 164 and thus one and the same plane mask register is used to write and read the data. However, a plane mask register for data writing and a plane mask register for data reading may also be provided separately. If provided separately then, immediately after a plane is read, data can be written into another plane. Therefore, with the separated structure, data processings can be performed quickly when a plane to be read is different from a plane to be written.

Figure 9:
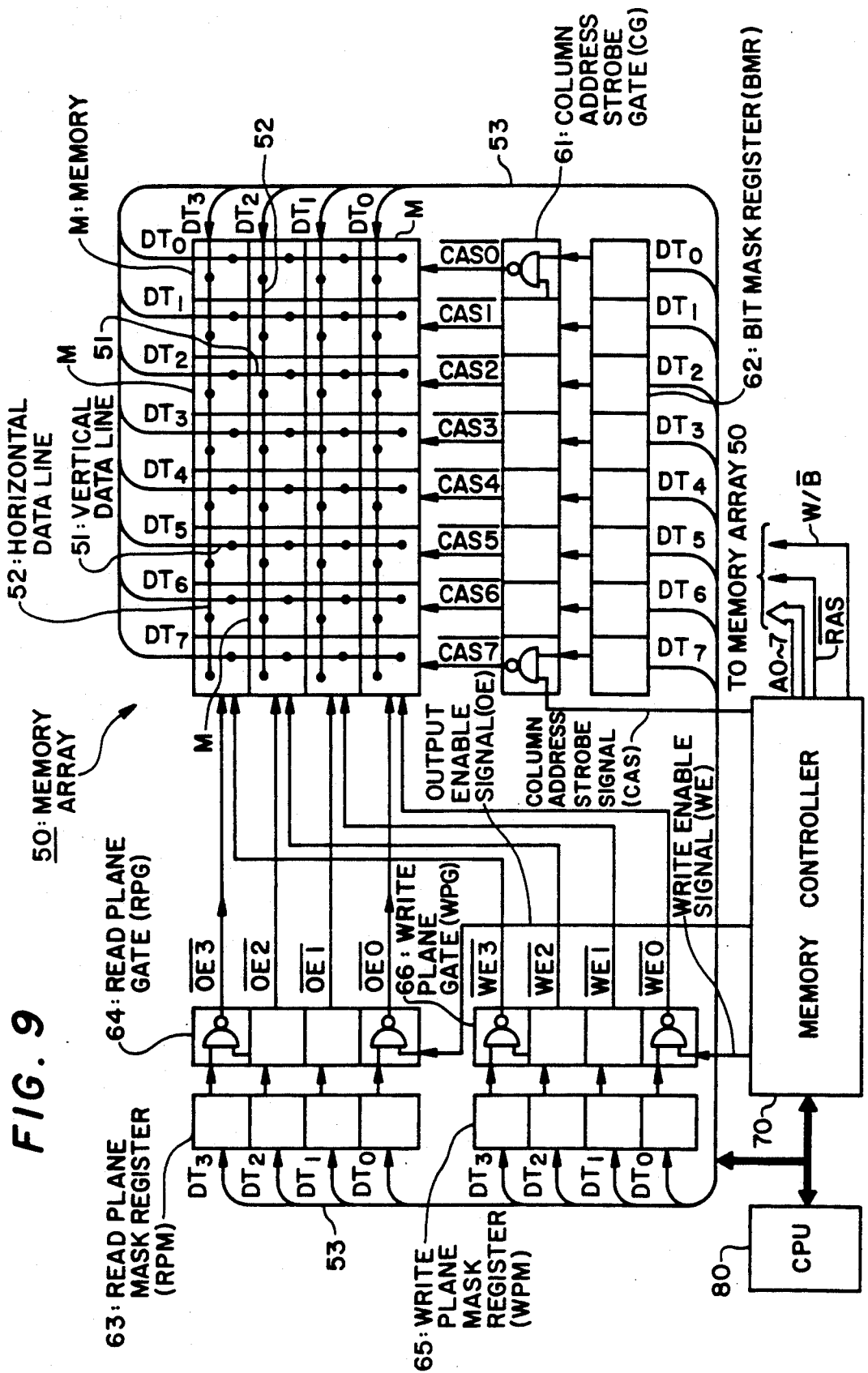
FIG. 9 is a circuit diagram of a modification of the embodiment shown in FIG. 3.

FIG. 9 shows a block diagram of a modified version of the embodiment shown in FIG. 3. In FIG. 9, Memory Array 50 is composed of a plurality of Memories M which are arranged two-dimensionally. In Memory Array 50, Memories M are combined horizontally to structure a word, while Memories M are combined vertically to structure 1 pixel (display 1 dot).

The row data terminals of Memories M arranged in the same row are connected to one another and the connection points thereof are then connected to data lines which extend in the vertical direction. Also, the data terminals of Memories M arranged in the same pixel are connected to one another and the connection points thereof are then connected to horizontal data lines 52, respectively.

Further, the above-mentioned data lines 51, 52 are connected to one another. In this case, the corresponding bits of Data Lines 51, 52 are connected to one another, which enables Data Lines 51 and 52 to provide the same data bus 53. The reason why Data Bus 53 can be provided in common by the vertical data lines 51 and horizontal data lines 52 is that the vertical and horizontal data lines 51 and 52 are not used at the same time. The above-mentioned explanation is the same as the explanation given for the FIG. 3 embodiment.

Also in FIG. 9, in relation to predetermined Memories M existing along rows within Memory Array 50, there are provided a read plane mask register 63 and a read plane gate 64 as row read inhibit mask means to inhibit and mask reading operations.

Among a plurality of Memories M arranged in the same horizontal direction, the output enable signal terminals of the respective memories M are connected to one another, and the connection points thereof are then connected to the output terminals of Read Plane Gate 64, respectively.

Further in FIG. 9, in relation to predetermined Memories M existing along rows within Memory Array 50, there are provided a write plane mask register 65 and a write plane gate 66 as row write inhibit mask means to inhibit and mask writing operations.

Among a plurality of Memories M arranged in the same horizontal direction, the write enable signal terminals of the respective memories M are connected to one another and the connection points thereof are then connected to the output terminals of Write Plane Gate 66, respectively.

Moreover, in FIG. 9, there are provided a column address strobe gate 61 and a bit mask register 62, as row inhibit mask means to inhibit and mask reading or writing operations, in relation to predetermined Memories M existing in along rows within Memory Array 50.

Among a plurality of Memories M arranged in the same vertical direction, the column address strobe terminals of the respective memories M are connected to one another, and the connecting points thereof are then connected to the corresponding connection terminals of Column Address Strobe Gate 66.

In relation to predetermined Memories M present in columns within Memory Array 50, there are provided a column address strobe gate 61 and a bit mask register 62, as column inhibit mask means to inhibit and mask reading or writing operations.

Among a plurality of Memories M arranged in the same vertical direction, the column address strobe terminals of the respective memories M are connected to one another, and the connection points thereof are then connected to the corresponding connection terminals of Column Address Strobe Gate 61.

The outputs A 0~7, row address strobe signal, and data buffer select signal from Memory Controller (or, Video Processor) 70 are supplied in common to all Memories M in Memory Array 50.

Read Plane Mask Register 63 and Write Plane Mask Register 65 are respectively adapted to hold mask information for the respective planes in Memory Array 50, according to instructions from CPU 80 or Memory Controller 70.

Bit Mask Register 62 is adapted to hold mask information for the respective pixels in Memory Array 50, in accordance with instructions from CPU 80 or Memory Controller 70. The outputs of Bit Mask Register 62 are supplied to Output Enable/Write Enable Gate 61, where they are NANDed with the column address strobe signals from Memory Controller 70 to provide column address strobe signals for the respective pixels in Memory Array 50.

Next, will be described the operation of the embodiment shown in FIG. 9. First, the case where CPU 80 performs row access will be explained.

In this case, by setting the data buffer select signal to an "1" level, row access is selected. Mask data is set in Write Plane Mask Register 65 according to colors to be written/planes to be used, thereby setting Bit Mask Register 62 all to "1s". After that, if a memory access is executed, then the outputs A 0~7, row address strobe signal, column address strobe signal, write enable signal and output enable signal are output from Memory Controller 70 at given timings, respectively.

When CPU 80 runs the writing operation, concurrently with the operation of Memory Controller 70, the write data is output from CPU 80 and is written in the row/horizontal direction via Data Bus 53 and Data Line 51. In this case, the same write data is written into the respective authorized planes. In other words, when row writing is being performed, at least one bit of Write Plane Mask Register 65 may be set to an "1", or two or more bits thereof may be set to "1s" simultaneously. As a result of this, the same write data is written into the bit or bits set to "1s", concurrently.

If arbitrary data is set in Bit Mask Register 62 prior to the above-mentioned writing, then the writing can be performed only in an arbitrary bit of the word or in an arbitrary portion thereof.

When row readout is performed, if one bit of Read Plane Mask Register 63 is set to an "1" level, then the row read data that corresponds to the bit set to an "1" level can be obtained in Data Bus 53 through Data Line 51.

The above-mentioned description about the operation of the embodiment shown in FIG. 9 is basically similar to that of the embodiment in FIG. 3. However, the embodiment of FIG. 9 is different from that of FIG. 3 in that Plane Mask Register 65 for data writing and Plane Mask Register 63 for data reading are provided individually. Therefore, in the embodiment of FIG. 9, immediately after a plane is read out, data can be written into another plane. As a result, in a case where a plane to read and a plane to write are different from each other, processings can be done quickly.

Next, we will describe the case where CPU 80 runs column (pixel) access. This description is also similar to that of FIG. 3 in principle.

First, row access is selected by setting the data buffer select signal to a "0" level. Then, Read Plane Mask Register 63 and Write Plane Mask Register 65 are all set to "1s", one bit of Bit Mask Register 62 is set, and a read or write operation is carried out via Data Line 52 and Data Bus 53. In this case, correspondingly to a word address in which a pixel to be accessed is present, the values of A 0~7 are determined and, correspondingly to the bit position within the word, the value of Bit Mask Register 62 is determined.

Figure 11:
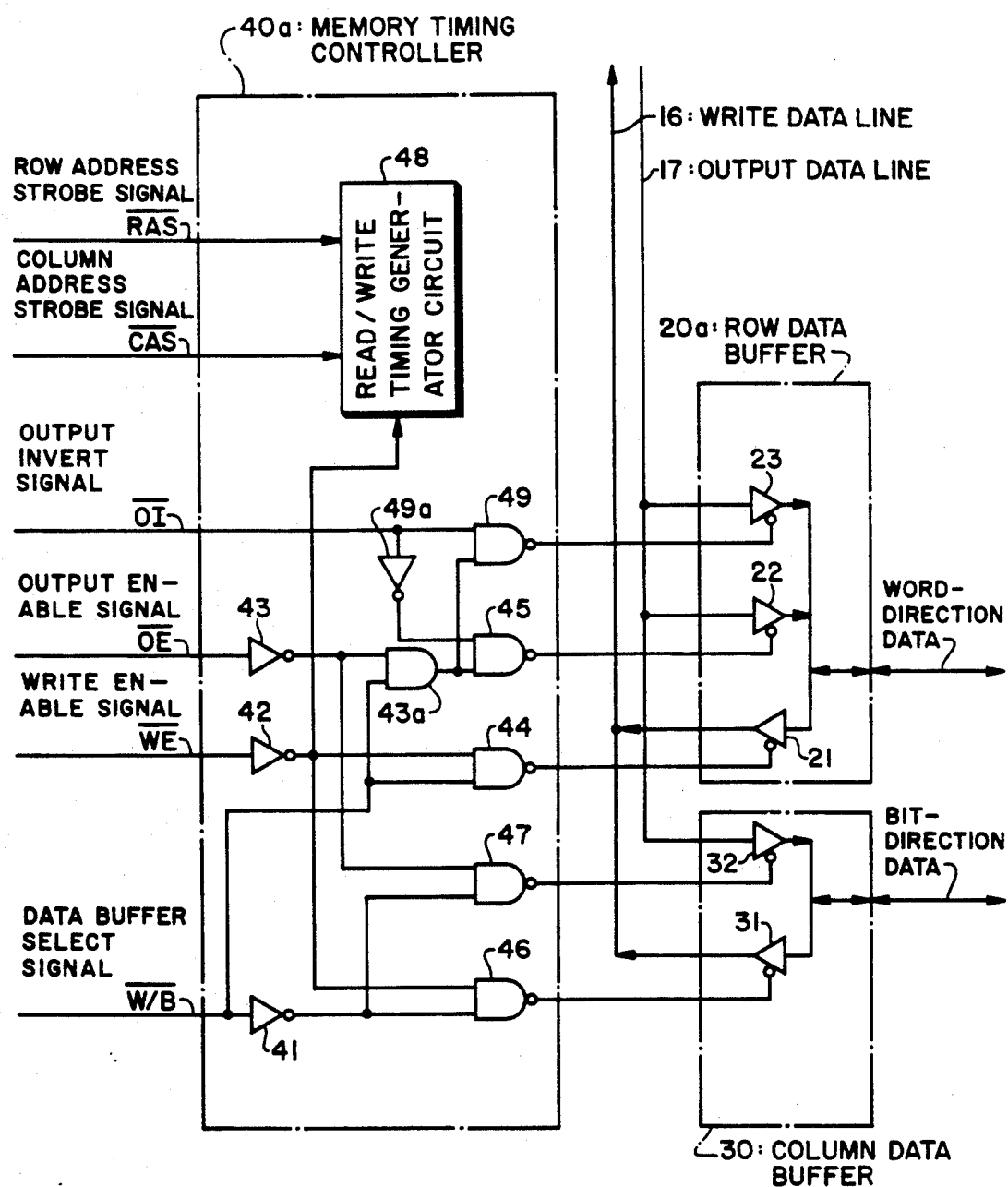
FIG. 11 is a circuit diagram of a modification of the embodiment shown in FIG. 2.

FIG. 11 shows a circuit diagram of a modification of the embodiment shown in FIG. 2. The embodiment of FIG. 11 is different from the embodiment of FIG. 2 in that AND Circuit 43a, NAND Circuit 49, Inverter 49a and Buffer 23 are newly provided.

Next, will be described the operation of the embodiment shown in FIG. 11. This operation is basically similar to that of the embodiment of FIG. 2.

In the embodiment in FIG. 11, however, in order to reverse and output the data stored in Memory Cell Array 15, the output enable signal may be set to a "0" level and at the same time an output reverse signal may be set to an "1" level. As a result of this, the data is output externally of Memory M via Buffer 23 instead of Buffer 22 in Row Data Buffer 20a, so that the output data is output after it is reversed. However, the above-mentioned output reverse signal is effective only when the data buffer select signal is at an "1" level, because it can be output only for the row data.

Figure 10:
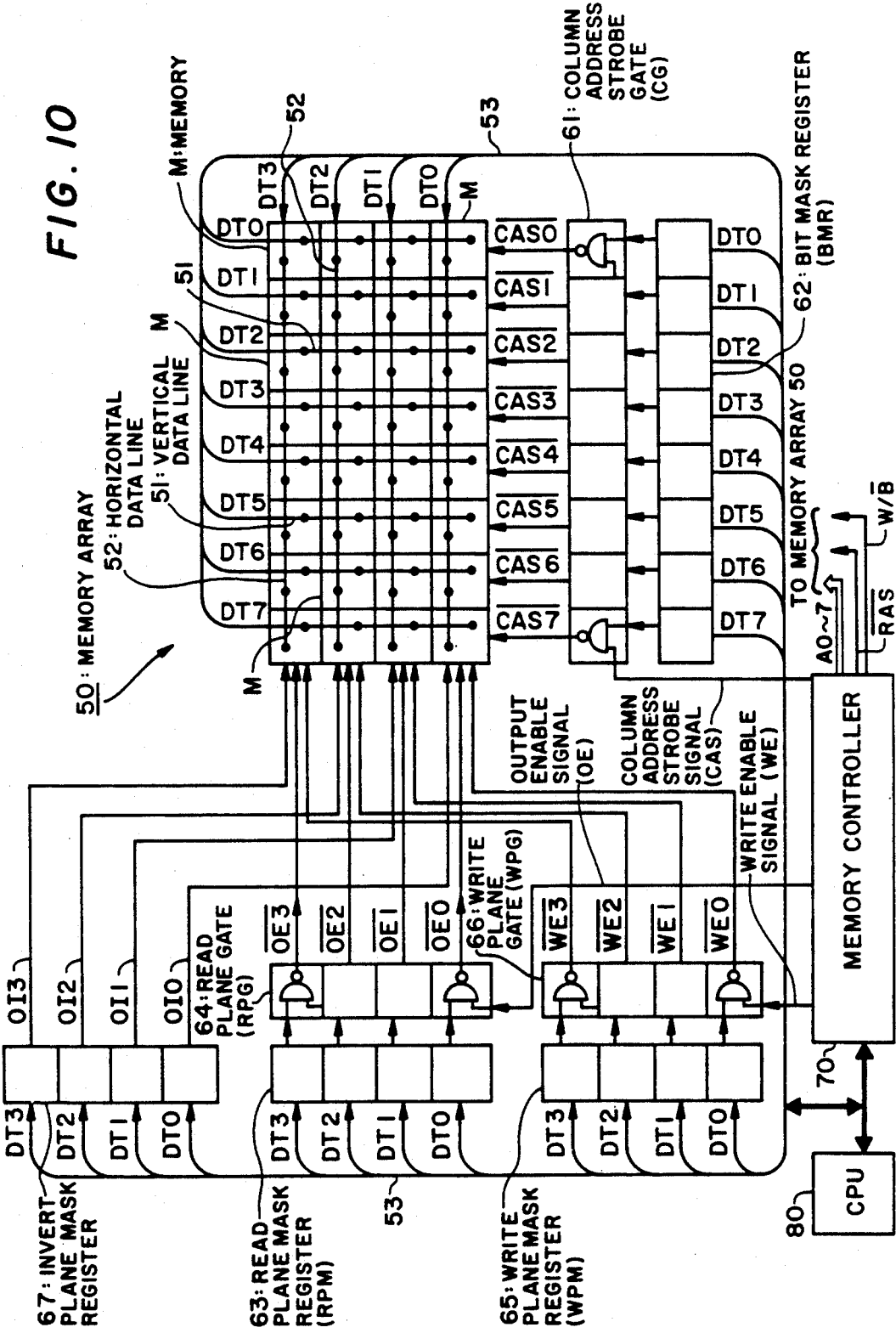
FIG. 10 is a block diagram of a modification of the embodiment shown in FIG. 9.

FIG. 10 illustrates a block diagram of a modified version of the embodiment shown in FIG. 9. The embodiment in FIG. 10 differs from the embodiment in FIG. 9 in that Invert Plane Mask Register 67 is newly provided.

Invert Plane Mask Register 67 is used to instruct the reverse of an output signal in a given plane within Memory Array 50. Also, in this embodiment, among a plurality of Memories M arranged in the same horizontal direction, the output reverse signal terminals of the respective memories M are connected to one another, and the connecting points thereof are then connected to the output terminals of Invert Plane Mask Register 67. Also, Invert Plane Mask Register 67 is adapted to hold reverse instruction information for a given screen within Memory Array 50 in accordance with an instruction from CPU 80 or Memory Controller 70.

Next, will be described a case where color codes are compared. First, it is assumed that a portion of the contents of Memory Array 50 is in a state as shown in FIG. 12(A), In this state, a given color code, for example, "1 0 1 1" is to be detected. This code, "1 0 1 1", is shown by a heavy line in FIG. 12(A). That is, in FIG. 12(A), the signal "1 0 1 1" exists in Bit 4 and Bit 0, respectively.

In this case, the complement (a signal obtained when a color code signal is inverted) of the above-mentioned color code signal is "0 1 0 0", and this is set in Invert Plane Mask Register 67. A state set in this manner is shown in FIG. 12(B). That is, all bits that correspond to planes 3, 1, 0 are set to "0s", and only the bit that corresponds to Plane 2 is set to a "1". And, only the signal of Plane 2 set to an "1" is reversed or inverted before it is output.

In other words, the output invert signal of Memory M corresponding to the plane that is set to an "1" level goes to an "1". On the other hand, the output enable signal is a "0" and the "0" inverted to an "1" by means of Inverter 43, while the data buffer select signal is an "1", with the result that AND Circuit 43a outputs a "1". And, due to the "1" of the above-mentioned output invert signal, NAND Circuit 49 outputs a "0". Thus, Data Buffer 23 inverts its output signal.

The contents of the outputs in the respective planes in Memory Array 50 after inverted in the above-mentioned case are shown in FIG. 12(C). In FIG. 12(C), a signal which is invertedly output is shown by a heavy line.

In this state, the outputs of Memory Array 50 are wired ANDed on Vertical Data Line 51, with the result that an 8-bit signal shown in FIG. 12(D) is obtained. This result appears on Data Bus 53 as a word output.

Therefore, in a given bit, if there is present at least one "0" in the outputs corresponding to the respective planes, then the output corresponding to the given bit goes to a "0", while in a given bit, if the outputs corresponding to the respective planes are all "1s", then the output corresponding to the given bit goes to an "1". Therefore, only when the pixel color codes are matched, the word output(s) corresponding to the bit(s) matched will go to an "1" or "1s". Since the above-mentioned output inversion and wired AND operations are executed in the read cycle of Memories M, the color codes can be detected at high speed.

Next, will be described an operation to detect the existence of the color codes. At first, a portion of the contents of Memory Array 50 is assumed to be in a state as shown in FIG. 13(A). In this state, the existence of any of the color codes is detected.

In FIG. 13(A), the color codes are present in Bit 4, Bit 2, and Bit 1, respectively. In this case, Invert Plane Mask Register 67 is set such that the outputs of all of the planes are inverted. That is, "1 1 1 1" is set in Invert Plane Mask Register 67. A state set in this manner is shown in FIG. 13(B).

In FIG. 13(C), there are shown the contents of the outputs for the respective planes in Memory array 50 after inverted in the above-mentioned case. In this state, the outputs of Memory Array 50 are wired ANDed on Vertical Data Line 51, with the result that a signal of 8 bits shown in FIG. 13(D) can be obtained. This result will appear on Data Bus 53 as a word output.

Accordingly, in a given bit, if there is at least one "0" in the outputs corresponding to the respective planes, the output corresponding to the given bit then goes to a "0", while in a given bit if the outputs corresponding to the respective planes are all "1s", then the output corresponding to the given bit will go to an "1". As a result of this, if any of the color codes are present, then the word output corresponding to the bit in which the color codes are present will go to a "0". In the above-mentioned case, however, it is assumed that even if a code "0 0 0 0" is present, no color code exists. Since the above-mentioned output inversion and wired AND operations are executed in the read cycle of Memories M, it is possible to detect the existence of the color codes at high speed.

Although, in the above-mentioned embodiment, four planes are employed, the number of the planes employed may be different. Also, 1 word may be composed of any number of bits. In Memory Array 50, the number of bits in a row may be greater or smaller than the number of bits in a column.

According to the above-mentioned embodiment of the invention, it is possible to reduce the time required to compare given color codes among color codes stored in an image memory, and at the same time to reduce the time required to detect the existence of any color codes.

Figure 14:
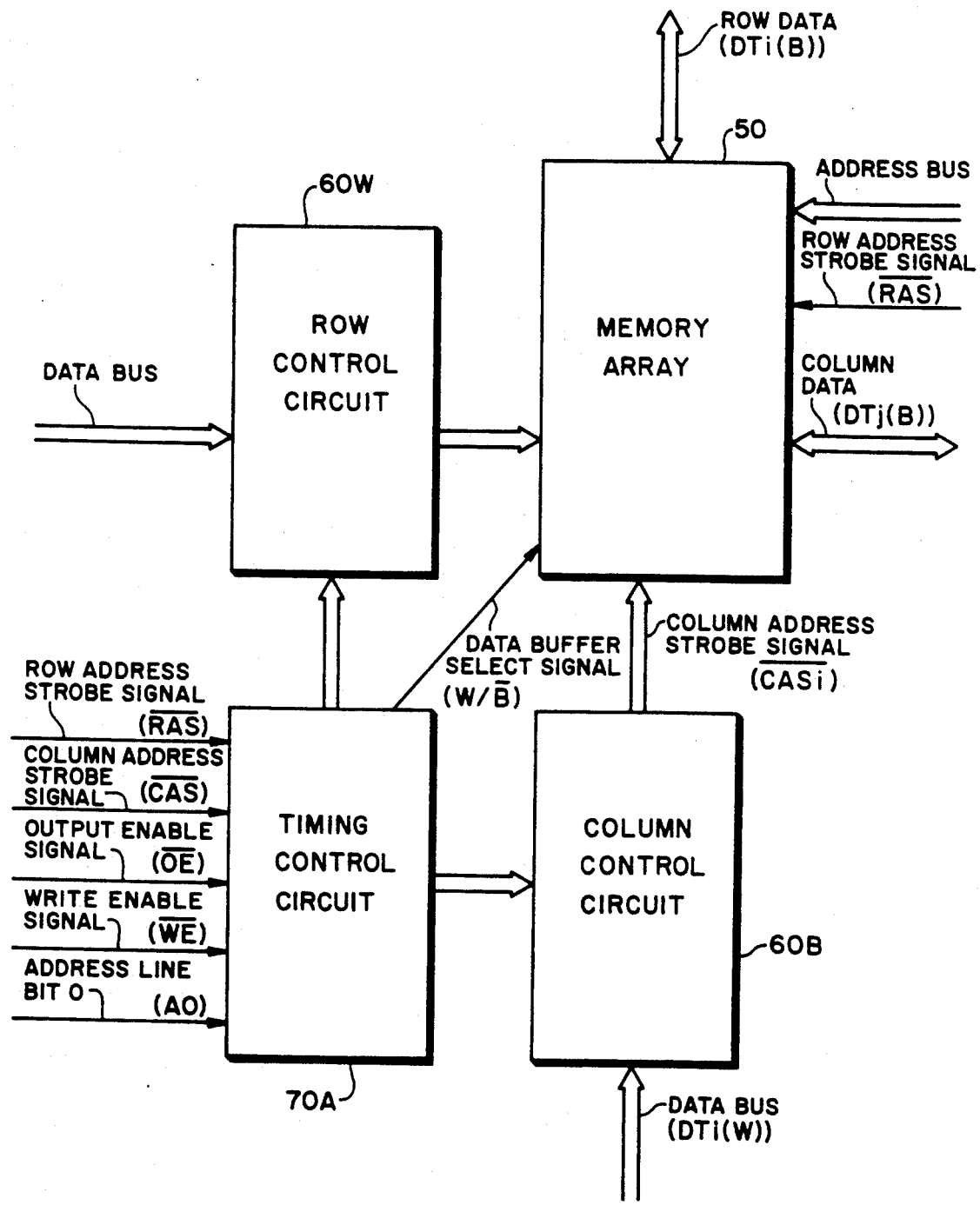
FIG. 14 is a block diagram of another embodiment of the invention.

FIG. 14 shows a block diagram of another embodiment of the invention. This embodiment comprises a memory array 50, a row control circuit 60W, a column control circuit 60B, and a timing control circuit 70A to control the timings of the above-mentioned respective circuits.

Row Control Circuit 60W controls a row or plane-direction control line in Memory Array 50, in which there are present a number of circuits corresponding to the number i (e.g., i=0~7) of bits forming a word.

Column Circuit 60B controls a column or pixel control line, in which there are present a number of circuits corresponding to the number j (e.g., j=0~3) of bits forming a pixel.

A data bus going to Row Control Circuit 60W and Column Circuit 60B can be provided in common in any data bus, and an address line is supplied to the whole memory array 50.

Memory Array 50 is composed of a plurality of memories, each of which is used as a VRAM(Video RAM) or a program memory.

Timing Control Circuit 70A receives a row address strobe signal, a column address strobe signal, an output enable signal, a write enable signal, and an address line bit 0(A 0) signal, and also outputs various control signals.

Figure 15:
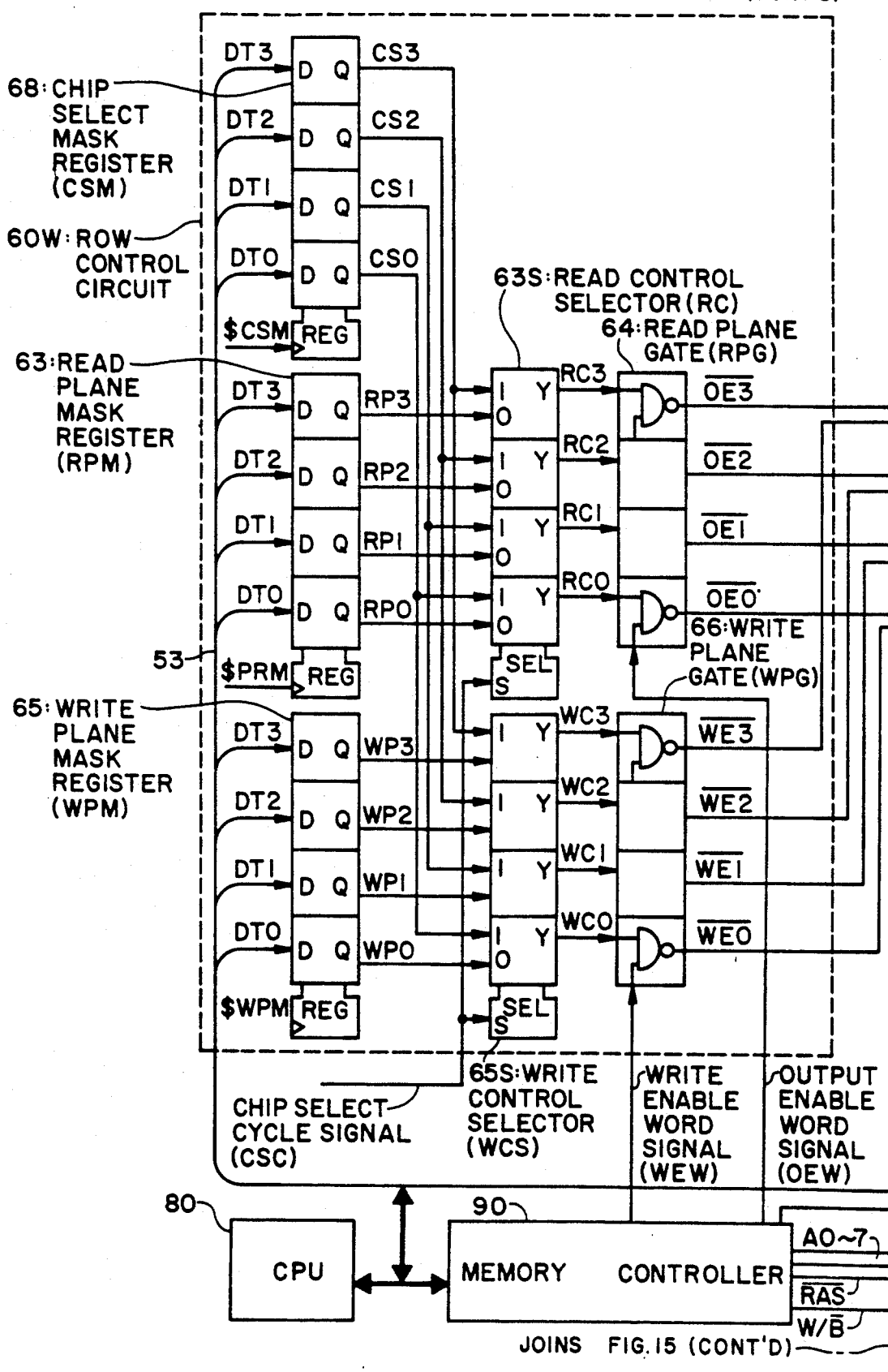
FIG. 15 is a circuit diagram showing the FIG. 14 embodiment in greater detail.
Figure 15:
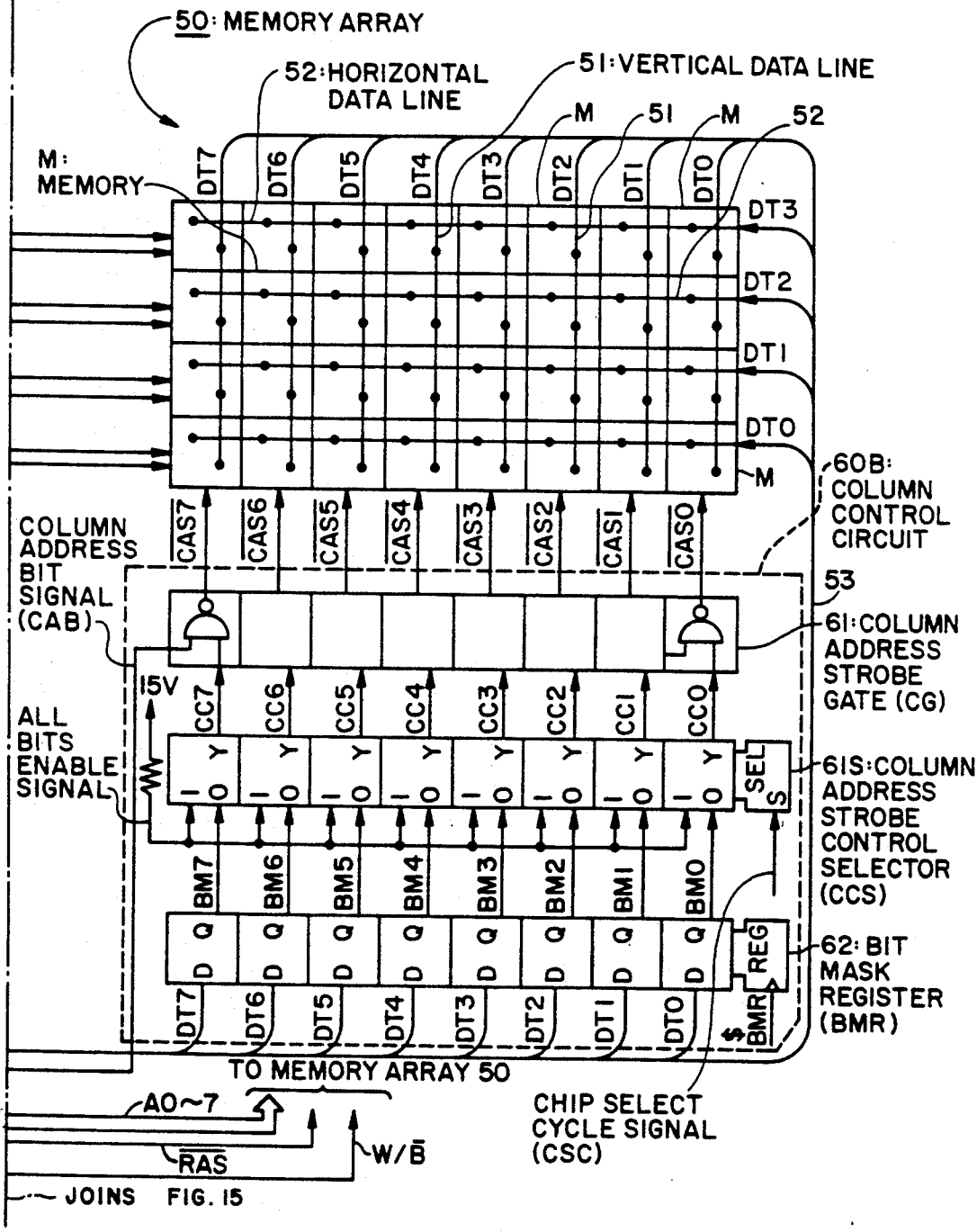

FIG. 15 shows a detailed diagram of the embodiment shown in FIG. 14, and illustrates a modified version of the embodiment shown in FIG. 10.

The embodiment of FIG. 15 differs from that of FIG. 10 in that a column address strobe control selector (CCS) 61S, a read control selector (RC) 63S and a write control selector (WCS) 65S are newly provided, and also in that a chip select mask register (CSM) 68 is provided in place of Invert Plane Mask Register 67. Next, will be described the inner parts of Row Control Circuit 60W.

Row Control Circuit 60W includes Chip Select Mask Register 68 which serves to hold information used to select chips in Memory Array 50.

For Memories M existing along rows within Memory Array 50 there are provided a read plane mask register 63, Read Control Selector 63S, and a read plane gate 64, as row read inhibit mask means to inhibit and mask reading operations.

Read Control Selector 63S is a selector to select chip select information and read plane mask information in accordance with a chip select cycle signal.

Among a plurality of Memories M arranged in the same horizontal direction, the output terminals of Read Plane Gate 64 are interconnected with the output enable signal terminals of the respective memories M.

Also, within Row Control Circuit 60W there are provided a write plane mask register 65, Write Control Selector 65S, and a write plane gate 66, as row write inhibit mask means to inhibit and mask writing operations.

Write Control Selector 65S is a selector to select the chip select information and write plane mask information in accordance with a chip select cycle signal.

Among a plurality of Memories M arranged in the same horizontal direction, the write enable signal terminals of respective memories M are connected with one another, and the connection points thereof are then connected with the output terminals of Write Plane Gate 66.

Next, the internal parts of Column Control Circuit 60B will be discussed. For Memories M existing along columns within Memory Array 50 there are provided a column address strobe gate 61, Column Address Strobe Control Selector 61S, and a bit mask register 62, as column inhibit mask means to inhibit and mask the read or write operations thereof.

Column Address Strobe Control Selector 61S is a selector to select column address strobe controlling signals (all-enable signals and column mask information) in accordance with respective memory cycles.

Among a plurality of Memories M arranged in the same vertical direction, the column address strobe terminals of the respective memories M are connected with one another and the connecting points thereof are then connected with the corresponding connection terminals of Column Address Strobe Gate 61.

Memory Controller 90 (or, video processor) includes therein Timing Controller 70, and outputs A 0~7, row address strobe signal, data buffer select signal are supplied in common to all memories M in Memory Array 50.

Figure 16:
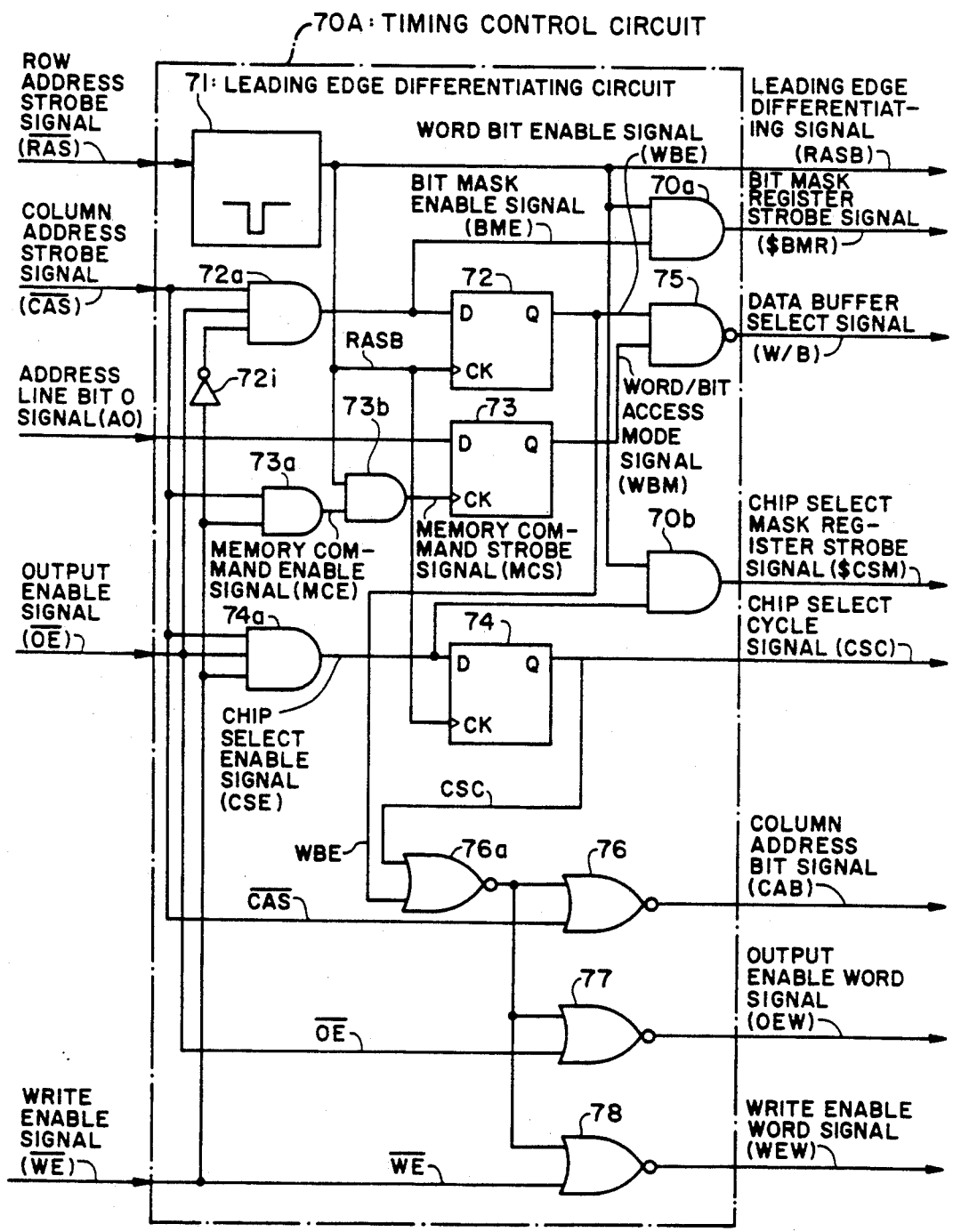
FIG. 16 is a circuit diagram to show an example of a timing control circuit shown in FIG. 14.

FIG. 16 shows a circuit diagram illustrating the timing control circuit 70A of FIG. 14. A differentiating circuit 71 is provided to create a front edge differentiation signal of the row address strobe signal, a flipflop 72 is provided to hold a word bit enable signal, and an AND gate 72a and an inverter 72i are respectively provided to output the word bit enable signal. Also, a flipflop 73 is provided to serve as a command register to specify a word/bit access mode, and is also adapted to store a value of an address line as a memory command.

AND circuits 73a, 73b are respectively adapted to create a memory command enable signal and a memory command strobe signal. AND Circuits 73a, 73b also form command receive cycle indicating means to allow a memory system to accept a memory command thereto. The term "memory system" used here means the whole circuit shown in FIG. 15.

A flipflop 74 is used to specify a chip select cycle (this means a memory cycle to create a program memory access) or a VRAM access cycle (this means a memory cycle to perform an image memory access).

An AND circuit 74a is provided to create a chip select enable signal.

The values of the above-mentioned flipflops 72~74 are determined by the input levels of other signals at a timing of the front or leading edge of the row address strobe signal.

A NAND circuit 75 is used to create a data buffer select signal. The output of NAND Circuit 75 becomes a "0" only when Flipflops 72 and 73 have been set and at that time, specify row access.

NOR circuits 76a, 76, 77, 78 are respectively adapted to create the column address bit signal, output enable word signal, and write enable word signal. NOR circuits 76~78 can be operated as AND circuits since the respective control signals thereof are input in the form of negative signals and they output a control signal at a cycle where the word enable signal and chip select cycle signal are set.

Also, there are provided an AND circuit 70a which serves to create a bit mask register strobe signal by the word bit enable signal and bit mask enable signal, and an AND circuit 70b which creates a chip select mask register strobe signal by the word bit enable signal and chip select enable signal.

Next, will be explained the operation of the above-mentioned embodiment using a timing chart. First, a condition to provide the program memory access is specified by the fact that at a time just before the low address strobe signal becomes active, the column address strobe signal is at an "1" level and the write enable signal is at an "1" level. On the other hand, a condition to provide the VRAM access is specified by the fact that, at the above-mentioned time, the column address strobe signal is at an "1" level and the write enable signal is at a "0" level.

Figure 17:
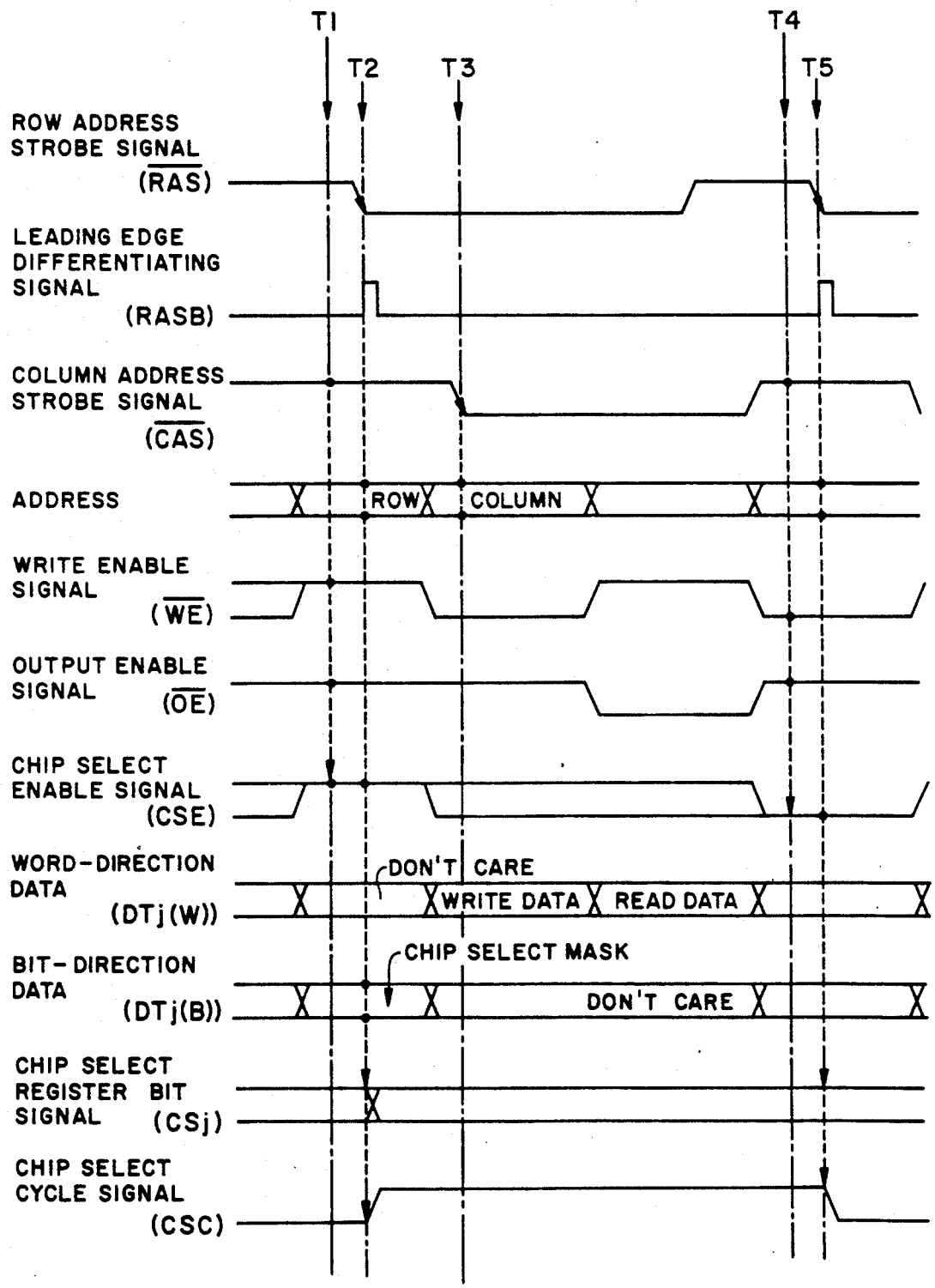
FIG. 17 is a timing chart showing program memory access.

FIG. 17 is a timing chart for illustrating the operation of the program memory access. At a time T1, the column address strobe signal is at an "1" level and the write enable signal is at an "1" level, thereby allowing the chip select enable signal to go to an "1" level.

At a time T2, the row address is taken in and SCSM shown in FIG. 15 is issued, so that, in accordance with the value of the row data, the value of Chip Select Mask Register 67 is set and reset. Then, Flipflop 74 is set and enters the chip select cycle (program memory access). In this chip select cycle, according to the address of a program, normally only 1 bit of Chip Select Mask Register 67 is set by Memory Controller 90.

When Flipflop 74 is set, then Read Control Selector 63S and Write Control Selector 65S respectively select the chip select information, and Memory Array 50 is now ready for use as an ordinary program memory.

Then, at a time T3 the column address is taken in and reading or writing a program on Memory Array 50 is carried out.

At and from the time T3, at a timing where the column address strobe signal is active, an ordinary read/write is controlled and executed by the write enable signal and output enable signal. At this time, since the word bit enable signal is at a "0" level, the output of NAND Circuit 75 becomes an "1", thereby providing row access.

At following times T4, T5, the same operation as at the times T1, T2 is executed, thereby entering the next memory cycle.

Figure 18:
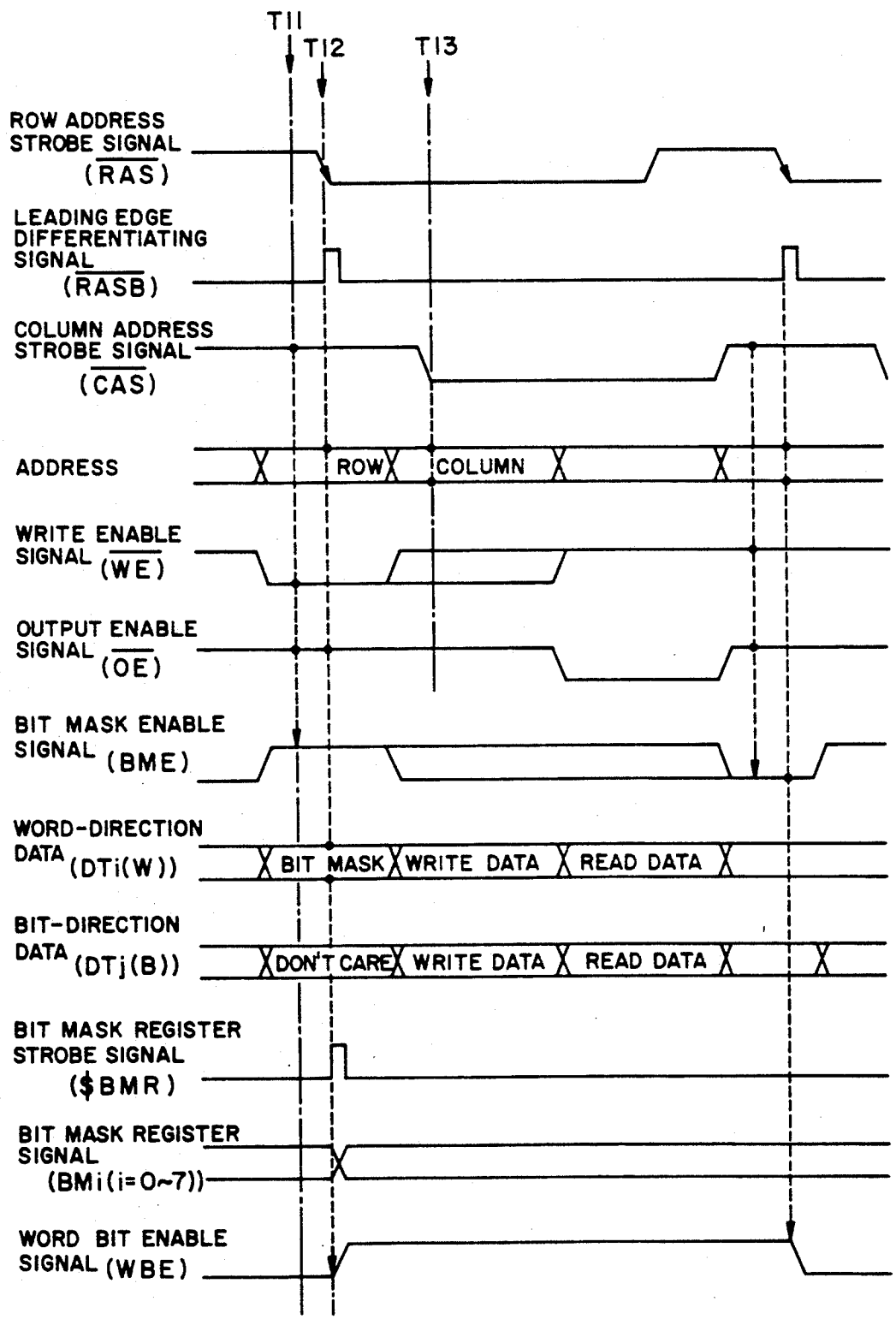
FIG. 18 is a timing chart showing VRAM access.

FIG. 18 is a timing chart of the operation of the VRAM access. At a time T11, the column address strobe signal is at an "1" level and the write enable signal is at a "0" level, so that the chip select enable signal goes to a "0" level.

On the other hand, the word bit enable signal goes to an "1" level, and at a time T12 a row address is taken in and at the same time the word bit enable signal is set. Simultaneously with this, SBMR shown in FIG. 15 is output, with the result that the value of the row data is loaded into Bit Mask Register 62.

In this cycle since Flipflop 74 is not set, Read Control Selector 63S and Write Control Selector 65S select the read plane mask information and write plane mask information (these two kinds of mask information are previously given from Memory Controller 90 or CPU), respectively. As a result of this, a condition to run the VRAM access to be described below is prepared.

At a time T13 a column address is taken in and. in Memory Array 50, VRAM writing or reading is executed. In the VRAM access, since the word bit enable signal is set, the data buffer select signal is determined according to a word/bit access mode signal. As a result of this row access or column access is provided. In this case, either the row data bus or the column data bus is employed for the input/output of the data. Also, since Write Plane Mask Register 65 and Read Plane Mask Register 53 are effective as well, since Bit Mask Register 62 can be varied in each memory cycle, the VRAM access can be run dynamically.

Next, will be explained a memory command. Here the term "memory command cycle" means an operation for a memory controller to specify an operation mode to a memory. A condition to run the memory command cycle can be specified by the fact that, just before a timing where the row address strobe signal falls, the column address strobe signal is at a "0" level and the write enable signal is at a "0" level.

Figure 19:
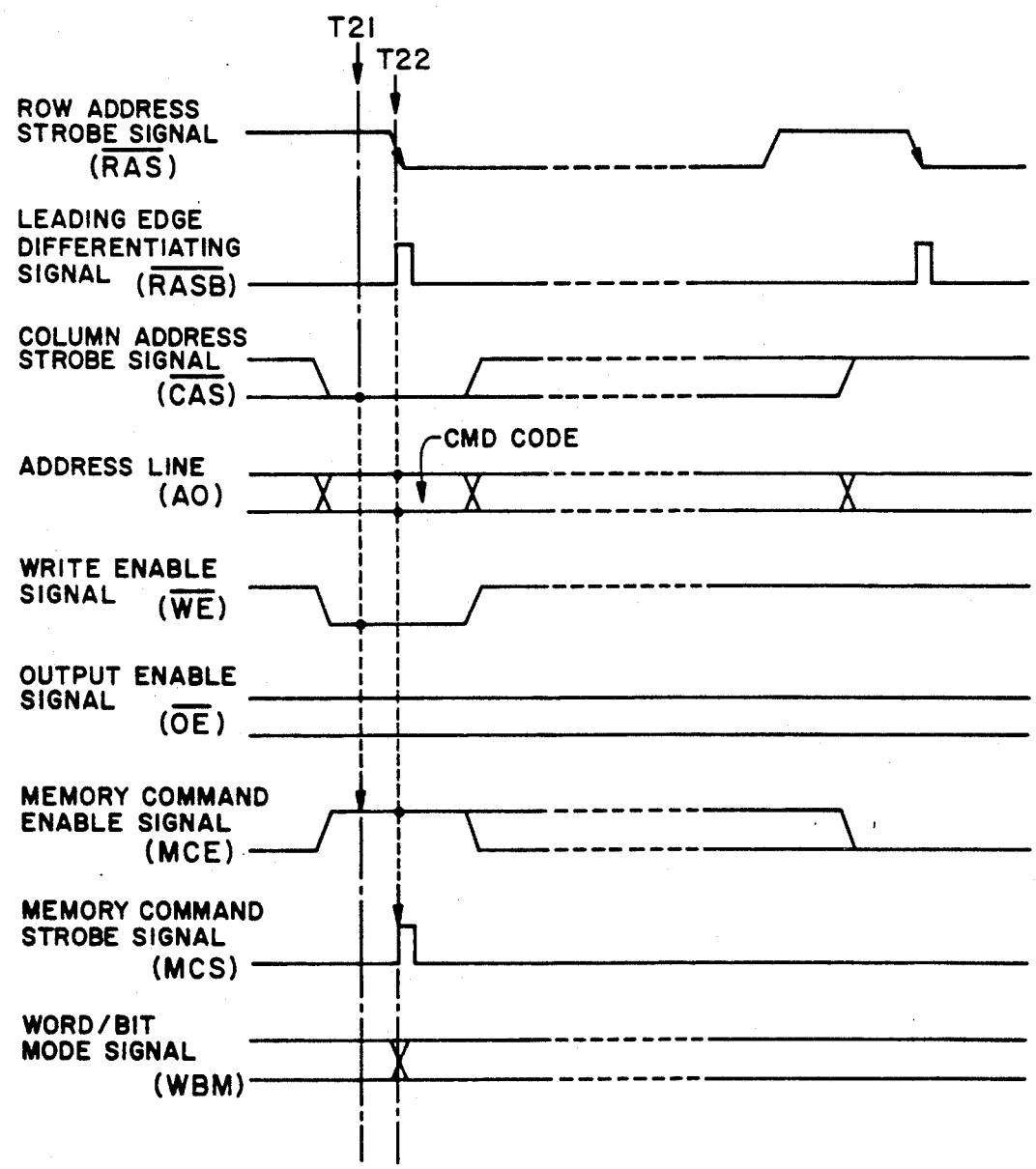
FIG. 19 is a timing chart showing a memory command cycle.

FIG. 19 is a timing chart of the operation of the memory command. At a time T21, the column address strobe signal is at a "0" level and the write enable signal is at a "0" level, whereby the output signal of AND Circuit 73a goes to an "1" level and, at a time T22, AND Circuit 73a outputs.

As a result of this, the value of the word/bit access mode signal is determined according to the value of the then address line bit 0 signal. Therefore, the controller is able to specify either row access or column access according to the value of the address line bit 0 signal via the address line bit 0 signal. In this case, since the word bit enable signal and the chip select signal are not set, a control signal is not output to Memory Array 50.

Also, since the memory command cycle is similar to a conventional automatic refresh cycle (cycle and hidden refresh cycle), the refreshment of the memory can also be executed simultaneously.

Figure 20:
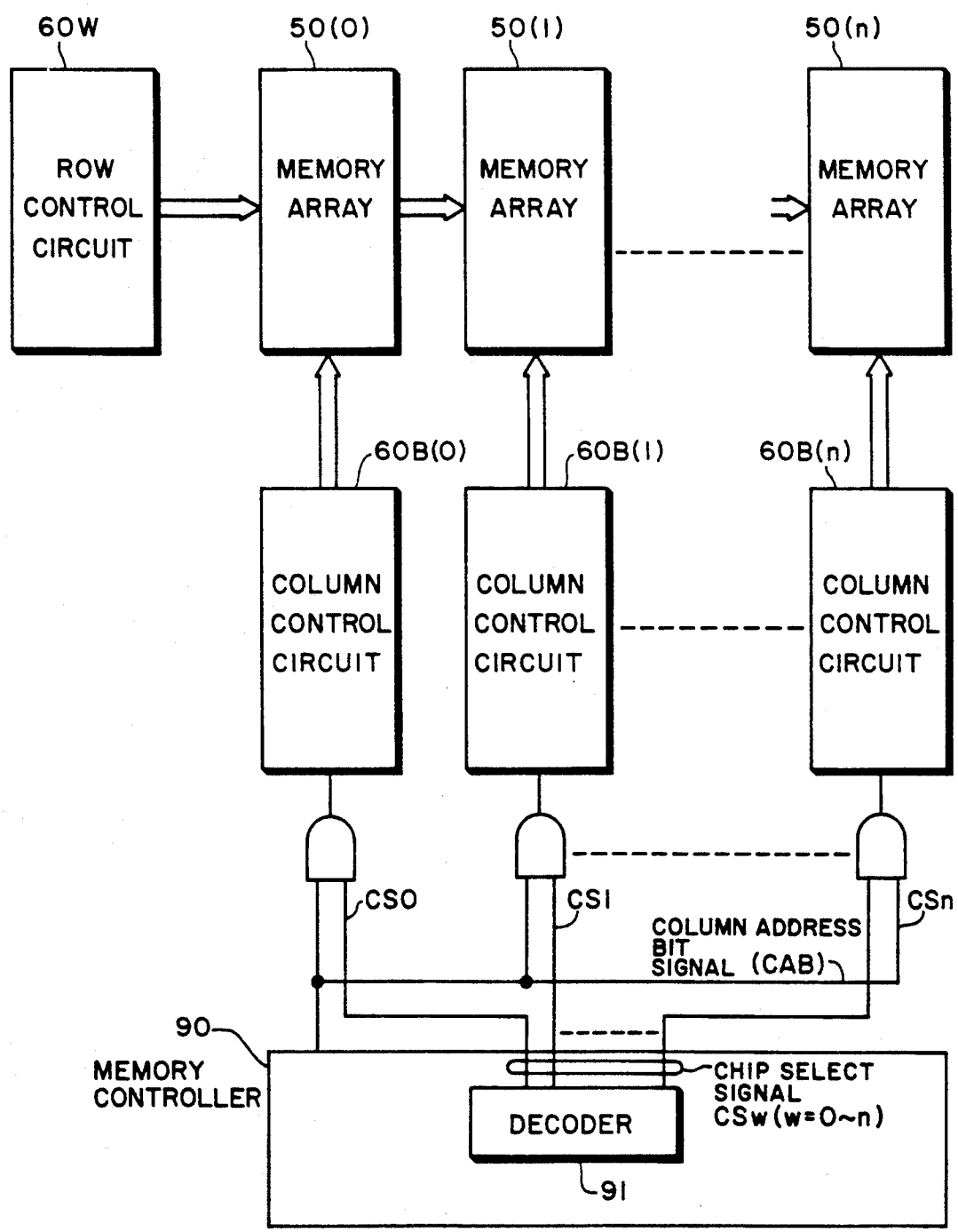
FIG. 20 is a block diagram of a modification of the embodiment shown in FIG. 15.

FIG. 20 is a block diagram showing a modified version of the embodiment of FIG. 15. In this embodiment, there are provided a plurality of Memory Arrays 50, shown in FIG. 15, and a plurality of Column Control Circuits 60B; that is, they correspond to each other in number. And, both of them are selected by Memory Controller 90.

In other words, each of Memory Arrays 50 (0), 50(1), . . . , 50 (n) is identical with Memory Array 50 while each of Column Control Circuits 60B (0), 60B (0), . . . , 60B (n) is identical with Column Control Circuit 60B. And, one of Column Control Circuits 60B (0)~60B (n) is specified in accordance with a chip select signal output from Decoder 91 within Memory Controller 90.

In this manner, an easy addressing can be achieved while a memory capacity is increased.

What is claimed is:

1. A memory system for reading and writing data through data lines, said memory system comprising:
   memory array means including a plurality of memories arranged two-dimensionally in a row and column array;
   first memory interface means comprising a row data buffer for data along rows of said memory array means and serving as a row input/output interface to said memory array means;
   second memory interface means comprising a column data buffer for data along columns of said memory array means and serving as a column input/output interface to said memory array means and being able to operate independent of said row data buffer;
   data buffer select means for selecting one of said two data buffers;
   direction control means for operating one of said two data buffers as an input interface or output interface in accordance with a reading or writing operation, respectively, on the memory contents of said memory system;
   signal invert means for inverting output signals from said memory array means to form an inverted memory array containing inverted signals; and,
   AND means provided for ANDing all bits along respective columns of the inverted memory array to obtain an ANDed bit value for each respective column of the inverted memory array.

2. A memory system as set forth in claim 1, wherein said memory array means includes a first plurality of input/output signal lines extending along one direction of said memory array means and a second plurality of input/output signal lines extending along another direction of said memory array means, respective ones of said first plurality of input/output signal lines being connected to respective ones of said second plurality of input/output signal lines.

3. A memory system as set forth in claim 1 wherein the number of bits along said rows is different from the number of bits along said columns.

* * * * *